(12) United States Patent
Okaniwa et al.

(10) Patent No.: US 11,924,979 B2
(45) Date of Patent: Mar. 5, 2024

(54) RESIN COMPOSITION, LAMINATE, SEMICONDUCTOR WAFER WITH RESIN COMPOSITION LAYER, SUBSTRATE FOR MOUNTING SEMICONDUCTOR WITH RESIN COMPOSITION LAYER AND SEMICONDUCTOR DEVICE

(71) Applicant: MITSUBISHI GAS CHEMICAL COMPANY, INC., Tokyo (JP)

(72) Inventors: Masashi Okaniwa, Tokyo (JP); Takenori Takiguchi, Tokyo (JP); Kohei Higashiguchi, Tokyo (JP); Tsuyoshi Kida, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 737 days.

(21) Appl. No.: 17/049,224

(22) PCT Filed: Apr. 24, 2019

(86) PCT No.: PCT/JP2019/017364
§ 371 (c)(1),
(2) Date: Oct. 20, 2020

(87) PCT Pub. No.: WO2019/208615
PCT Pub. Date: Oct. 31, 2019

(65) Prior Publication Data
US 2021/0147629 A1 May 20, 2021

(30) Foreign Application Priority Data

Apr. 26, 2018 (JP) .................. 2018-084967

(51) Int. Cl.
C08K 5/29 (2006.01)
B32B 27/28 (2006.01)
B32B 27/36 (2006.01)
C08F 222/40 (2006.01)
C08G 73/10 (2006.01)
C08K 3/36 (2006.01)
C08K 5/14 (2006.01)
C08L 79/08 (2006.01)
H01L 23/00 (2006.01)
H01L 23/29 (2006.01)
H05K 3/30 (2006.01)

(52) U.S. Cl.
CPC .......... *H05K 3/305* (2013.01); *B32B 27/281* (2013.01); *B32B 27/36* (2013.01); *C08F 222/40* (2013.01); *C08F 222/404* (2020.02); *C08G 73/1046* (2013.01); *C08K 3/36* (2013.01); *C08K 5/14* (2013.01); *C08K 5/29* (2013.01); *C08L 79/085* (2013.01); *H01L 23/295* (2013.01); *H01L 24/29* (2013.01); C08K 2201/003 (2013.01); C09J 2203/326 (2013.01); H01L 2224/2919 (2013.01); H01L 2224/2929 (2013.01); H01L 2924/0635 (2013.01); H01L 2924/07025 (2013.01)

(58) Field of Classification Search
None
See application file for complete search history.

(56) References Cited

U.S. PATENT DOCUMENTS

| | | | | |
|---|---|---|---|---|
| 2,255,313 A | * | 9/1941 | Ellis | .............. C08L 67/06 |
| | | | | 525/518 |
| 2,647,092 A | * | 7/1953 | Meeske | ............ C09D 151/08 |
| | | | | 525/7.1 |
| 2003/0111519 A1 | | 6/2003 | Kinney et al. | |
| 2003/0221770 A1 | * | 12/2003 | Meixner | ................ C09J 7/10 |
| | | | | 428/40.1 |
| 2010/0036136 A1 | * | 2/2010 | Musa | ............. C07D 207/452 |
| | | | | 548/406 |
| 2014/0242757 A1 | | 8/2014 | Yoko et al. | |
| 2017/0152418 A1 | | 6/2017 | Aoyama et al. | |
| 2021/0147680 A1 | * | 5/2021 | Higashiguchi | ........ C08L 61/04 |

FOREIGN PATENT DOCUMENTS

| | | |
|---|---|---|
| CA | 467387 A | 8/1950 |
| CN | 1549843 A | 11/2004 |
| CN | 104039913 A | 9/2014 |
| EP | 0 409 623 A1 | 7/1990 |
| EP | 969058 * | 1/2000 |
| EP | 2 755 234 A1 | 7/2014 |
| JP | 01-213324 A | 8/1989 |
| JP | 2005-501725 A | 1/2005 |
| JP | 2011-052109 A | 3/2011 |
| JP | 2014-194013 A | 10/2014 |
| JP | 2015-503220 A | 1/2015 |
| JP | 2015-32639 A | 2/2015 |
| JP | 2016-23256 A | 2/2016 |
| TW | 201323558 A1 | 6/2013 |
| WO | 2006/099162 A2 | 9/2006 |
| WO | 2016/31555 A1 | 3/2016 |

OTHER PUBLICATIONS

International issued in International Patent Application No. PCT/JP2019/017364, dated Jul. 30, 2019 and English Translation thereof.

* cited by examiner

Primary Examiner — David J Buttner
(74) Attorney, Agent, or Firm — GREENBLUM & BERNSTEIN, P.L.C.

(57) ABSTRACT

A resin composition that has both excellent flux activity and high insulation reliability, that possesses good storage stability, and that further has flexibility with good operability upon being used as a laminate is provided. The resin composition contains a chelating flux agent (A), a thermal radical polymerization initiator (B) and a radical polymerizable compound (C).

26 Claims, No Drawings

RESIN COMPOSITION, LAMINATE, SEMICONDUCTOR WAFER WITH RESIN COMPOSITION LAYER, SUBSTRATE FOR MOUNTING SEMICONDUCTOR WITH RESIN COMPOSITION LAYER AND SEMICONDUCTOR DEVICE

TECHNICAL FIELD

The present invention relates to a resin composition, a laminate using the resin composition, a semiconductor wafer with a resin composition layer, a substrate for mounting a semiconductor with a resin composition layer and a semiconductor device. In more detail, the present invention relates to a resin composition that is useful as an adhesive.

BACKGROUND ART

In recent years, in association with the downsizing and performance improvement of semiconductor devices, flip chip bonding is getting a lot of attention as a method for mounting a semiconductor chip (hereinafter, may be abbreviated as "a chip") on a substrate for mounting a semiconductor (hereinafter, may be abbreviated as the "substrate"). In the flip chip bonding, a construction method is common in which, after joining the chip and the substrate, the gap between the chip and the substrate is filled with an underfill material, which is then cured. However, due to the downsizing and performance improvement of semiconductor devices, the electrode pitch arranged on the chip has become narrower and the gap between the electrodes has also become narrower. As a result, there have been problems that operability is worsened due to a longer time for filling the underfill material, and that filling failures occur, such as unfilling. In response to this, a construction method has been examined in which, after supplying a pre-applied underfill material to the chip or substrate, the joint of the chip and the substrate and the filling of the underfill material are carried out at the same time.

When the joint between a chip and a substrate is carried out via a metal that is easily oxidized, such as solder or copper, a flux component derived from a carboxylic acid or the like may be added to a pre-applied underfill material for the purpose of removing an oxidized layer, which is an inhibiting factor for the joint, and obtaining good metal joint.

A flux component derived from a carboxylic acid or the like is present even after the bonding of the semiconductor package, and this corrodes and deteriorates the interconnection of solder and copper in the cured underfill material, or promotes the ionization of solder and copper. There is a concern that, due to their migration, short circuit defects are caused between the joints.

Patent Document 1 describes a film-like adhesive that contains a phenolic resin having a triazine skeleton. Since triazine forms a complex with a metal ion such as a copper ion or a tin ion generated from solder, there is an advantage in incorporation of a resin having that skeleton into the adhesive that electrical defects due to migration of metal ions can be suppressed.

Patent Document 2 describes a resin composition that contains a thermosetting resin and a chelating flux agent. When the chelating flux agent is used, the chelating flux agent captures metal ions in the cured product, thereby suppressing electrical defects due to migration of metal ions and forming reliable joints.

Patent Document 3 describes a pre-applied underfill material obtained by using a radical polymerizable monomer and a thermal radical initiator. By using the thermal radical initiator, it does not take a long time to cure the resin composition.

CITATION LIST

Patent Document

Patent Document 1: Japanese Patent Application Laid-Open No. 2011-052109
Patent Document 2: Japanese Translation of PCT International Application Publication No. 2005-501725
Patent Document 3: Japanese Translation of PCT International Application Publication No. 2015-503220

SUMMARY OF INVENTION

Technical Problem

However, in Patent Document 1, the adhesive does not contain a flux component, and therefore, the oxidized layer cannot be removed, and good metal joint cannot be obtained.

Also, Patent Document 2 describes a resin composition containing a chelating flux agent and an epoxy resin, and there is a disadvantage that the reaction between the epoxy resin and the phenolic hydroxy group that the chelating flux agent has progresses at a temperature lower than the temperature in the flip chip bonding and good metal joint cannot be obtained.

In Patent Document 3, a flux component is not contained, and therefore, the oxidized layer cannot be removed, and good metal joint cannot be obtained. Therefore, before using the underfill material, a step of removing the oxidized layer of the joint in advance is required, which complicates the operation process.

The present invention has been made in view of such problems, and an object of the present invention is to provide a resin composition that has both excellent flux activity, which is sufficient for removing the oxidized layer to obtain metal joint, and high insulation reliability, that possesses good storage stability, and that further has flexibility with good operability upon being used as a laminate.

Solution to Problem

The present inventors have, as a result of devoted examinations to solve the above problems, found out that a resin composition comprising a chelating flux agent (A), a thermal radical polymerization initiator (B) and a radical polymerizable compound (C) can solve the above problems, and reached the present invention.

More specifically, the present invention includes the following contents.

[1] A resin composition comprising: a chelating flux agent (A); a thermal radical polymerization initiator (B); and a radical polymerizable compound (C).

[2] The resin composition according to [1], wherein the chelating flux agent (A) has a melting point of 235° C. or lower.

[3] The resin composition according to [1] or [2], wherein the chelating flux agent (A) has a molecular weight of 150 or more and 500 or less.

[4] The resin composition according to any of [1] to [3], wherein a contact angle of a solder ball obtained in the following solder wettability test using the chelating flux agent (A) is less than 1.20 radians:

(Solder Wettability Test)

a glossy surface of a copper foil with a thickness of 12 μm is coated with the chelating flux agent, and a solder ball with a diameter of 0.5 mm is placed on the chelating flux agent; the resultant is then heated for 1 minute on a hot plate kept at 235° C. to melt the solder, which is then cooled at room temperature; and after the cooling, a radius (a) of the solder ball spread on the copper foil and a height (b) of the solder ball were measured, and a contact angle was calculated according to the following expression:

contact angle of solder ball=2 arctan{(b)/(a)}.

[5] The resin composition according to any of [1] to [4], wherein the chelating flux agent (A) comprises a compound represented by the following formula (1) and/or an imine compound represented by the following formula (2):

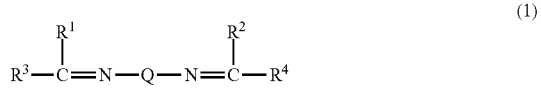

wherein Q is an arylene group, an alkylene group, an alkenylene group, a cycloalkylene group, a cycloalkenylene group, a heterocyclylene group or a heteroarylene group; $R^1$ and $R^2$ are each independently a hydrogen atom, a methyl group, an ethyl group, a propyl group, a butyl group, a pentyl group or a hexyl group; $R^3$ and $R^4$ are each independently an alkyl group, a cycloalkyl group, an aryl group, a heteroaryl group or a heterocyclyl group; and for the arylene group, the alkylene group, the alkenylene group, the cycloalkylene group, the cycloalkenylene group, the heterocyclylene group, the heteroarylene group, the alkyl group, the cycloalkyl group, the aryl group and the heteroaryl group, a hydrogen atom bonded to the group is optionally substituted with a hydroxy group or a mercapto group; and

wherein $R^5$ is a hydrogen atom, a methyl group, an ethyl group, a propyl group, a butyl group, a pentyl group or a hexyl group; $R^6$ and $R^7$ are each independently an alkyl group, a cycloalkyl group, an aryl group, a heteroaryl group or a heterocyclyl group; and for the alkyl group, the cycloalkyl group, the aryl group, the heteroaryl group and the heterocyclyl group, a hydrogen atom bonded to the group is optionally substituted with a hydroxy group or a mercapto group.

[6] The resin composition according to [5], wherein $R^3$ and $R^4$ in the imine compound represented by the above formula (1) are each a 2-hydroxyphenyl group.

[7] The resin composition according to any of [1] to [6], wherein the chelating flux agent (A) comprises at least one selected from the group consisting of N,N'-bis(salicylidene)-1,2-propanediamine, N,N'-bis(salicylidene)ethylenediamine, N,N'-bis(salicylidene)-1,3-propanediamine and N,N'-bis(salicylidene)-1,2-phenylenediamine.

[8] The resin composition according to any of [1] to [7], wherein the chelating flux agent (A) comprises N,N'-bis(salicylidene)-1,2-propanediamine and/or N,N'-bis(salicylidene)-1,3-propanediamine.

[9] The resin composition according to any of [1] to [8], wherein the thermal radical polymerization initiator (B) is an organic peroxide.

[10] The resin composition according to [9], wherein the thermal radical polymerization initiator (B) has a 10 hour half-life period temperature of 100° C. or higher.

[11] The resin composition according to [9] or [10], wherein the thermal radical polymerization initiator (B) is a dialkyl peroxide and/or a hydroperoxide.

[12] The resin composition according to any of [9] to [11], wherein the thermal radical polymerization initiator (B) comprises at least one selected from the group consisting of dicumyl peroxide, di(2-tert-butylperoxyisopropyl)benzene, di-tert-butyl peroxide, 1,1,3,3-tetramethylbutyl hydroperoxide, 2,5-dimethyl-2,5-di(tert-butylperoxy)hexyne-3, 2,5-dimethyl-2,5-di(tert-butylperoxy)hexane, di-tert-hexyl peroxide, tert-butyl cumyl peroxide, di-tert-amyl peroxide, tert-amyl hydroperoxide, tert-butyl hydroperoxide, cumene hydroperoxide, diisopropylbenzene hydroperoxide and p-menthane peroxide.

[13] The resin composition according to any of [9] to [12], wherein the thermal radical polymerization initiator (B) comprises at least one selected from the group consisting of dicumyl peroxide, cumene hydroperoxide, diisopropylbenzene hydroperoxide, di(2-tert-butylperoxyisopropyl)benzene and p-menthane hydroperoxide.

[14] The resin composition according to any of [1] to [13], wherein the radical polymerizable compound (C) is a compound comprising at least one functional group selected from the group consisting of a maleimide group, a (meth)acryloyl group, a propenyl group and a vinyl group.

[15] The resin composition according to [14], wherein the radical polymerizable compound (C) is the compound comprising the maleimide group.

[16]

The resin composition according to [14] or [15], wherein the radical polymerizable compound (C) comprises at least one selected from the group consisting of 2,2'-bis(4-(4-maleimidophenoxy)phenyl)propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, N-phenylmaleimide, a maleimide compound represented by the following formula (3), a maleimide compound represented by the following formula (4) and a maleimide compound represented by the following formula (5):

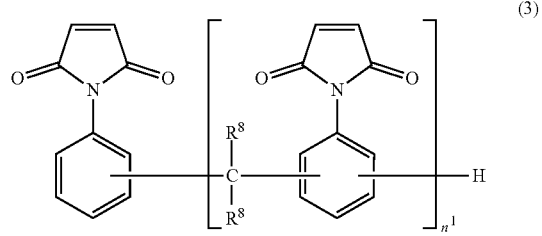

wherein each $R^8$ independently represents a hydrogen atom or a methyl group, and $n^1$ represents an integer of 1 or more;

(4)

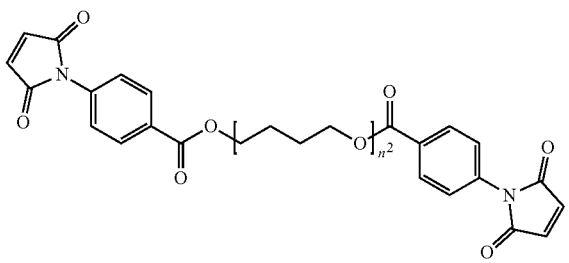

wherein an average value of $n^2$ is 1 or more and 30 or less; and (5)

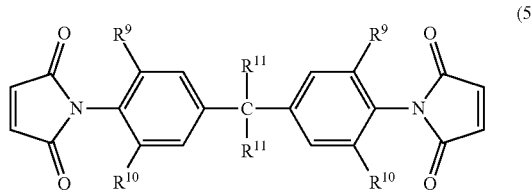

wherein $R^9$ and $R^{10}$ each independently represent a hydrogen atom, a methyl group or an ethyl group, and each $R^{11}$ independently represents a hydrogen atom or a methyl group.

[17] The resin composition according to any of [14] to [16], wherein the radical polymerizable compound (C) comprises at least one maleimide compound selected from the group consisting of 2,2'-bis(4-(4-maleimidophenoxy)phenyl)propane, the maleimide compound represented by the above formula (3), the maleimide compound represented by the above formula (4) and the maleimide compound represented by the above formula (5).

[18] The resin composition according to any of [1] to [17], wherein a content of the chelating flux agent (A) in the resin composition is 5 parts by mass or more and 50 parts by mass or less based on 100 parts by mass of a total amount of the radical polymerizable compound (C).

[19] The resin composition according to any of [1] to [18], wherein a content of the thermal radical polymerization initiator (B) in the resin composition is 0.005 parts by mass or more and 5 parts by mass or less based on 100 parts by mass of a total amount of the radical polymerizable compound (C).

[20] The resin composition according to any of [1] to [19], further comprising an inorganic filler (D).

[21] The resin composition according to [20], wherein the inorganic filler (D) has an electrical insulation property.

[22] The resin composition according to [20] or [21], wherein the inorganic filler (D) comprises at least one selected from the group consisting of silica, aluminum hydroxide, alumina, boehmite, boron nitride, aluminum nitride, magnesium oxide and magnesium hydroxide.

[23] The resin composition according to any of [20] to [22], wherein the inorganic filler (D) has an average particle diameter of 3 m or less.

[24] The resin composition according to any of [20] to [23], wherein a content of the inorganic filler (D) in the resin composition is 300 parts by mass or less based on 100 parts by mass of a total amount of the radical polymerizable compound (C).

[25] The resin composition according to any of [1] to [24], further comprising a flexibility imparting component (E).

[26] The resin composition according to [25], wherein the flexibility imparting component (E) comprises a thermoplastic polymer compound; and the thermoplastic polymer compound has a weight average molecular weight of 1,000 or more and 1,000,000 or less.

[27] The resin composition according to [25] or [26], wherein the flexibility imparting component (E) is a (meth)acrylic oligomer and/or a (meth)acrylic polymer.

[28] The resin composition according to any of [1] to [27], for use in a pre-applied underfill material.

[29]
A laminate comprising: a supporting material; and a layer comprising the resin composition according to any of [1] to [28] laminated on the supporting material.

[30]
A semiconductor wafer with a resin composition layer, comprising: a semiconductor wafer; and the laminate according to [29] laminated on the semiconductor wafer, wherein the layer comprising the resin composition is laminated on the semiconductor wafer.

[31]
A substrate for mounting a semiconductor with a resin composition layer, comprising: a substrate for mounting a semiconductor; and the laminate according to [29] laminated on the substrate for mounting the semiconductor, wherein the layer comprising the resin composition is laminated on the substrate for mounting the semiconductor.

[32] A semiconductor device comprising the semiconductor wafer with the resin composition layer according to [30]; and/or the substrate for mounting the semiconductor with the resin composition layer according to [31].

Advantageous Effects of Invention

According to the present invention, a resin composition that has both excellent flux activity and high insulation reliability, that possesses good storage stability, and that further has flexibility with good operability upon being used as a laminate can be obtained. In addition, by coating a supporting material with the resin composition, a laminate having a resin composition layer that is excellent in flux activity, insulation reliability and storage stability can be provided.

DESCRIPTION OF EMBODIMENTS

Hereinafter, an embodiment for performing the present invention (hereinafter, simply referred to as the "present embodiment") will be described in detail. Note that the present embodiment below is given in order to illustrate the present invention, and the present invention is not limited only to the present embodiment.

As used herein, "(meth)acrylo" means both "acrylo" and "methacrylo" corresponding to that. "(Meth)acryl" means both "acryl" and "methacryl" corresponding to that. "(Meth) acrylate" means both "acrylate" and "methacrylate" corresponding to that.

A resin composition according to one aspect of the present embodiment contains a chelating flux agent (A), a thermal radical polymerization initiator (B) and a radical polymerizable compound (C). The resin composition of the present embodiment is useful as a pre-applied underfill material.

A resin composition according to another aspect of the present embodiment contains an inorganic filler (D) in addition to the components described above.

A resin composition according to another aspect of the present embodiment contains a flexibility imparting component (E) in addition to the components described above.

In another aspect of the present embodiment, a laminate obtained by using the resin composition according to the present embodiment (hereinafter, also referred to as the "resin laminate"), a semiconductor wafer with a resin composition layer fabricated by using the laminate, a substrate for mounting semiconductors with a resin composition layer fabricated by using the laminate, and a semiconductor device fabricated by using the resin composition of the present embodiment are also provided.

[I. Resin Composition]

A resin composition of the present embodiment contains a chelating flux agent (A), a thermal radical polymerization initiator (B) and a radical polymerizable compound (C). The resin composition of the present embodiment is useful as an adhesive to be used for the flip chip bonding. The resin composition of the present embodiment may further contain an inorganic filler (D) and/or a flexibility imparting component (E).

[I-1. Chelating Flux Agent (A)]

By using the chelating flux agent (A) according to the present embodiment, a weaker acidity is achieved compared to the conventional carboxylic acid-based flux component, and improvement in insulation reliability is expected.

For the chelating flux agent (A) according to the present embodiment, during the flip chip bonding, from the viewpoint of enhancing the mobility of the flux agent at or below the melting point of solder and expressing a flux activity for sufficiently removing the oxidized layer, when the solder type is, for example, a tin-silver alloy, the melting point of the chelating flux agent at a state of being alone is preferably 235° C. or lower and is more preferably 180° C. or lower. Although the lower limit is not particularly limited, it is −50° C.

In addition, the chelating flux agent (A) according to the present embodiment preferably has a molecular weight of 150 or more and more preferably has a molecular weight of 200 or more because it is necessary to prevent the chelating flux agent (A) from being volatilized before the flux activity is expressed in the flip chip bonding, that is, to prevent the chelating flux agent (A) from being volatilized before the oxidized layer at the joint is removed. Also, the chelating flux agent (A) according to the present embodiment preferably has a molecular weight of 500 or less and more preferably has a molecular weight of 400 or less because a sufficient flux activity is obtained when the chelating flux agent (A) has high mobility even in the resin composition.

In the chelating flux agent (A) according to the present embodiment, the contact angle of a solder ball obtained in the following solder wettability test using the chelating flux agent alone is preferably less than 1.20 radians and is more preferably less than 1.10 radians from the viewpoint of enabling good joint between the connection terminals in the flip chip bonding. Note that a specific testing method is as described in Examples.

(Solder wettability test)

A glossy surface of a copper foil with a thickness of 12 μm is coated with the chelating flux agent and a solder ball with a diameter of 0.5 mm is placed on the chelating flux agent. The resultant is then heated for 1 minute on a hot plate kept at 235° C. to melt the solder, which is then cooled at room temperature. After the cooling, a radius (a) of the solder ball spread on the copper foil and a height (b) of the solder ball were measured and a contact angle was calculated according to the following expression:

contact angle of solder ball=2 arctan{(b)/(a)}.

Although the chelating flux agent (A) according to the present embodiment is not particularly limited as long as it is a flux agent that functions as a metal ion trapping agent, it is preferably an imine compound represented by the following formula (1) and/or the following formula (2). By using such an imine compound, metal ions such as copper ions can be efficiently captured, and an effect of suppressing a short circuit defect and the like caused by induction of migration is expected.

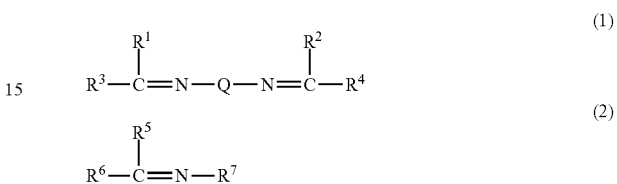

In an imine compound represented by the formula (1), Q is an arylene group, an alkylene group, an alkenylene group, a cycloalkylene group, a cycloalkenylene group, a heterocyclylene group or a heteroarylene group; $R^1$ and $R^2$ are each independently a hydrogen atom, a methyl group, an ethyl group, a propyl group, a butyl group, a pentyl group or a hexyl group; and $R^3$ and $R^4$ are each independently an alkyl group, a cycloalkyl group, an aryl group, a heteroaryl group or a heterocyclyl group. For the arylene group, the alkylene group, the alkenylene group, the cycloalkylene group, the cycloalkenylene group, the heterocyclylene group, the heteroarylene group, the alkyl group, the cycloalkyl group, the aryl group and the heteroaryl group, a hydrogen atom bonded to the group is optionally substituted with a hydroxy group or a mercapto group.

Although the arylene group is not particularly limited, examples thereof include, for example, phenylene (o-phenylene, m-phenylene and p-phenylene), biphenylene, naphthylene, binaphthylene, anthracenylene and phenanthrylene groups.

Although the alkylene group is not particularly limited, examples thereof include, for example, a linear alkylene group such as methylene, ethylene, trimethylene, tetramethylene, pentamethylene, hexamethylene, heptamethylene, octamethylene, nonamethylene, decamethylene, undecamethylene, dodecamethylene, tridecamethylene, tetradecamethylene, pentadecamethylene and hexadecamethylene groups; and a branched alkylene group such as methylethylene, methylpropylene, ethylethylene, 1,2-dimethylethylene, 1,1-dimethylethylene, 1-ethylpropylene, 2-ethylpropylene, 1,2-dimethylpropylene, 2,2-dimethylpropylene, 1-propylpropylene, 2-propylpropylene, 1-methyl-1-ethylpropylene, 1-methyl-2-ethyl-propylene, 1-ethyl-2-methylpropylene, 2-methyl-2-ethyl-propylene, 1-methylbutylene, 2-methylbutylene, 3-methylbutylene, 2-ethylbutylene, methylpentylene, ethylpentylene, methylhexylene, methylheptylene, methyloctylene, methylnonylene, methyldecylene, methylundecylene, methyldodecylene, methyltetradecylene and methyloctadecylene groups.

Although the alkenylene group is not particularly limited, examples thereof include, for example, vinylene, 1-methylvinylene, propenylene, 1-butenylene, 2-butenylene, 1-pentenylene and 2-pentenylene groups.

Although the cycloalkylene group is not particularly limited, examples thereof include, for example, a cyclopropylene group, a cyclobutylene group, a cyclopentylene group, a cyclohexylene group, a cycloheptylene group, a cyclooctylene group, cyclohexenylene, 1,2-cyclohexylenebis(methylene), 1,3-cyclohexylenebis(methylene) and 1,4-cyclohexylenebis.

Although the cycloalkenylene group is not particularly limited, examples thereof include, for example, cyclopropenylene, cyclobutenylene, cyclopentenylene, cyclohexenylene and cyclooctenylene groups.

Although the heterocyclylene group is not particularly limited, examples thereof include, for example, tetrahydrofuran-2,5-diyl, morpholine-2,3-diyl, pyran-2,4-diyl, 1,4-dioxane-2,3-diyl, 1,3-dioxane-2,4-diyl, piperidine-2,4-diyl, piperidine-1,4-diyl, pyrrolidine-1,3-diyl, morpholine-2,4-diyl and piperazine-1,4-diyl.

The heteroarylene group is not particularly limited, and is a group obtained by substituting one or more carbon atoms among the carbon atoms of the arylene group described above with a heteroatom such as an oxygen atom, a sulfur atom, a nitrogen atom and a phosphorus atom. Specific examples include those obtained by making phenanthrene, pyrrole, pyrazine, pyridine, pyrimidine, indoline, isoindoline, quinoline, isoquinoline, quinoxaline, carbazole, phenylcarbazole, phenanthridine, acridine, furan, benzofuran, isobenzofuran, dibenzofuran, phenyldibenzofuran, diphenyldibenzofuran, thiophene, phenylthiophene, diphenylthiophene, benzothiophene, dibenzothiophene, phenylbenzothiophene, diphenylbenzothiophene, phenyldibenzothiophene and benzothiazole into divalent groups.

Although the alkyl group is not particularly limited, examples thereof include, for example, a methyl group, an ethyl group, a n-propyl group, an isopropyl group, a n-butyl group, a 2-butyl group, an isobutyl group, a tert-butyl group, a n-pentyl group, a 2-pentyl group, a tert-pentyl group, a 2-methylbutyl group, a 3-methylbutyl group, a 2,2-dimethylpropyl group, a n-hexyl group, a 2-hexyl group, a 3-hexyl group, a 2-methylpentyl group, a 3-methylpentyl group, a 4-methylpentyl group and a 2-methylpentan-3-yl group.

Although the cycloalkyl group is not particularly limited, examples thereof include, for example, a cyclopropyl group, a cyclobutyl group, a cyclopentyl group and a cyclohexyl group.

Although the aryl group is not particularly limited, examples thereof include, for example, a phenyl group, a naphthyl group, an anthryl group, a phenanthrenyl group and a biphenyl group.

Although the heteroaryl group is not particularly limited, examples thereof include a 2-oxopyrrolidino group, a piperidino group, a piperazinyl group, a morpholino group, a tetrahydrofuryl group, a tetrahydropyranyl group, a tetrahydrothienyl group, a perhydronaphthyl group, a pyrrolyl group, a furyl group, a thienyl group, a pyridyl group, a pyrimidyl group, a pyrazyl group, a pyridazyl group, a pyrazolyl group, an imidazolyl group, an oxazolyl group, a thiazolyl group, an indolyl group, a benzofuryl group, a benzothienyl group, a quinolyl group, an isoquinolyl group, a quinoxalyl group, a phthalazyl group, a quinazolyl group, a naphthyridyl group, a cinnolyl group, a benzimidazolyl group, a benzoxazolyl group, a benzothiazolyl group and a tetrahydronaphthyl group.

In an imine compound represented by the formula (2), $R^5$ is a hydrogen atom, a methyl group, an ethyl group, a propyl group, a butyl group, a pentyl group or a hexyl group; and $R^6$ and $R^7$ are each independently an alkyl group, a cycloalkyl group, an aryl group, a heteroaryl group or a heterocyclyl group. For the alkyl group, the cycloalkyl group, the aryl group, the heteroaryl group and the heterocyclyl group, a hydrogen atom bonded to the group is optionally substituted with a hydroxy group or a mercapto group. For the alkyl group, the cycloalkyl group, the aryl group, the heteroaryl group and the heterocyclyl group, the same applies as described above.

In an imine compound represented by the formula (1), it is preferable that $R^3$ and $R^4$ each be a 2-hydroxyphenyl group from the viewpoint of expressing excellent flux activity and efficiently capturing metal ions.

An imine compound represented by the formula (1) is preferably, for example, N,N'-bis(salicylidene)-1,2-propanediamine, N,N'-bis(salicylidene)ethylenediamine, N,N'-bis(salicylidene)-1,3-propanediamine and N,N'-bis(salicylidene)-1,2-phenylenediamine from the viewpoint of enhancing the mobility of the flux agent at or below the melting point of solder and expressing a flux activity for sufficiently removing the oxidized layer, and it is more preferably, for example, N,N'-bis(salicylidene)-1,2-propanediamine and/or N,N'-bis(salicylidene)-1,3-propanediamine from the viewpoint of both expressing excellent flux activity upon the bonding and suppressing the volatile portions upon the bonding.

These chelating flux agents can be used alone as one kind or can be used in combination of two or more kinds.

For the chelating flux agent (A), those commercially available may be used.

The content of the chelating flux agent (A) in the resin composition of the present embodiment is not particularly limited, but it is preferably 5 parts by mass or more and 50 parts by mass or less based on 100 parts by mass of the total amount of a radical polymerizable compound (C), which will be mentioned below, from the viewpoint of achieving both flux activity of the resin composition and storage stability of the varnish and resin composition, and it is more preferably 10 parts by mass or more and 35 parts by mass or less from the viewpoint of ensuring the storage stability of the varnish at room temperature.

[I-2. Thermal Radical Polymerization Initiator (B)]

The thermal radical polymerization initiator (B) according to the present embodiment is not particularly limited as long as it accelerates the radical polymerization reaction of the radical polymerizable compound (C), and those publicly known can be used. Above all, an organic peroxide is preferable from the viewpoint of storage stability of the varnish and resin composition and the temperature range during the flip chip bonding.

Examples of the organic peroxide include, for example, a diacyl peroxide, a peroxy dicarbonate, a peroxy ester, a peroxy ketal, a dialkyl peroxide and a hydroperoxide.

Examples of the diacyl peroxide include, for example, diisobutyryl peroxide, di(3,5,5-trimethylhexanoyl) peroxide, dilauroyl peroxide, disuccinic acid peroxide, di-(3-methylbenzoyl) peroxide, benzoyl (3-methylbenzoyl) peroxide and dibenzoyl peroxide.

Examples of the peroxy carbonate include, for example, di-n-propyl peroxydicarbonate, diisopropyl peroxydicarbonate, di(4-tert-butylcyclohexyl) peroxydicarbonate, di(2-ethylhexyl) peroxydicarbonate and di-sec-butyl peroxydicarbonate.

Examples of the peroxy ester include, for example, cumyl peroxyneodecanoate, 1,1,3,3-tetramethylbutyl peroxyneodecanoate, tert-hexyl peroxyneodecanoate, tert-butyl peroxyneodecanoate, tert-hexyl peroxypivalate, tert-butyl peroxypivalate, 1,1,3,3-tetramethylbutyl peroxy-2-ethylhexanoate, 2,5-dimethyl-2,5-di(2-ethylhexanoylperoxy)hexane, tert-hexyl peroxy-2-ethylhexanoate, tert-butyl peroxy-2-ethylhexanoate, tert-hexyl peroxyisopropyl monocarbonate, tert-butyl peroxy-3,5,5-trimethylhexanoate, tert-butyl peroxylaurate, tert-butyl peroxyisopropyl monocarbonate, tert-butyl peroxy-2-ethylhexyl monocarbonate, tert-hexyl peroxybenzoate, 2,5-dimethyl-2,5-di(benzoylperoxy)hexane, tert-butyl peroxyacetate, tert-butyl peroxy-3-methylbenzoate and tert-butyl peroxybenzoate.

Examples of the peroxy ketal include, for example, 1,1-di(tert-hexylperoxy)cyclohexane, 1,1-di(tert-butylperoxy)cyclohexane, 2,2-di(tert-butylperoxy)butane, n-butyl-4,4-di-(tert-butylperoxy)valerate and 2,2-di(4,4-di-(tert-butylperoxy)cyclohexyl)propane.

Examples of the dialkyl peroxide include, for example, di(2-tert-butylperoxyisopropyl)benzene, dicumyl peroxide, 2,5-dimethyl-2,5-di(tert-butylperoxy)hexane, tert-butyl cumyl peroxide, di-tert-hexyl peroxide, di-tert-butyl peroxide, di-tert-amyl peroxide and 2,5-dimethyl-2,5-di(tert-butylperoxy)hexyne-3.

Examples of the hydroperoxide include, for example, p-menthane hydroperoxide, diisopropylbenzene hydroperoxide, 1,1,3,3-tetramethylbutyl hydroperoxide, cumene hydroperoxide, tert-butyl hydroperoxide and tert-amyl hydroperoxide.

The thermal radical polymerization initiator (B) according to the present embodiment preferably has a 10 hour half-life period temperature of 100° C. or higher, and more preferably 110° C. or higher from the viewpoint where the thermal radical polymerization initiator (B) in the resin composition has good reactivity even after drying a varnish obtained by dissolving or dispersing the resin composition in an organic solvent. Although the upper limit is not particularly limited, it is, for example, 250° C. The 10 hour half-life period temperature refers to a temperature at which the time (half-life period) until the concentration of the thermal radical polymerization initiator is reduced to a half of the initial value when dissolved in a solvent (for example, benzene) is 10 hours. The 10 hour half-life period temperature can be measured as follows, for example. At first, the thermal radical polymerization initiator is dissolved in benzene to obtain a solution with a concentration of 0.1 mol/L. This solution is sealed in a glass tube whose inside air has been replaced with nitrogen in advance. Next, the thermal radical polymerization initiator is thermally decomposed by immersing the glass tube in a thermostat bath set to a predetermined temperature. Here, when the decomposition rate constant is defined as k, the time is defined as t, the initial concentration of the thermal radical polymerization initiator is defined as $[PO]_0$, and the concentration of the thermal radical polymerization initiator after the time t is defined as $[PO]_t$, the relationship, $kt=\ln [PO]_0/[PO]_t$ holds. Therefore, by plotting the relationship between the time t and $\ln [PO]_0/[PO]_t$ on a graph, the decomposition rate constant k can be determined from the slope. Since the relationship $[PO]_0/[PO]_t=2$ holds for the half-life period tin, the half-life period $t_{1/2}$ at a certain temperature can be determined from the relational expression $t_{1/2}=\ln 2/k$. By determining the half-life period $t_{1/2}$ for a plurality of temperatures and plotting the relationship between $\ln t_{1/2}$ and $1/T$ on a graph, the 10 hour half-life period temperature can be obtained. T is an absolute temperature (unit: K). In addition, data of the 10 hour half-life period temperature described in catalogs or technical documents issued by manufacturing corporations of the thermal radical polymerization initiator may be utilized.

As the thermal radical polymerization initiator (B), a dialkyl peroxide and/or a hydroperoxide are preferable from the viewpoint where it has good reactivity even after drying a varnish obtained by dissolving or dispersing the resin composition in an organic solvent.

Among the above, from the viewpoint of solvent solubility, dicumyl peroxide, di(2-tert-butylperoxyisopropyl)benzene, di-tert-butyl peroxide, 1,1,3,3-tetramethylbutyl hydroperoxide, 2,5-dimethyl-2,5-di(tert-butylperoxy)hexyne-3, 2,5-dimethyl-2,5-di(tert-butylperoxy)hexane, di-tert-hexyl peroxide, tert-butyl cumyl peroxide, di-tert-amyl peroxide, tert-amyl hydroperoxide, tert-butyl hydroperoxide, cumene hydroperoxide, diisopropylbenzene hydroperoxide and p-menthane peroxide are more preferable, and from the viewpoint where volatile portions can be suitably suppressed upon drying the varnish and upon the bonding, dicumyl peroxide, cumene hydroperoxide, diisopropylbenzene hydroperoxide, di(2-tert-butylperoxyisopropyl)benzene and p-menthane hydroperoxide are still more preferable.

For the thermal radical polymerization initiator (B) according to the present embodiment, those commercially available may be used, and examples thereof include, for example, PERBUTYL H, PERCUMYL H, PEROCTA H, PERCUMYL P and PERMENTA H (hereinbefore, hydroperoxides), PERHEXYNE 25B, PERBUTYL D, PERBUTYL C, PERHEXA 25B, PERHEXYL D, PERCUMYL D and PERBUTYL P (hereinbefore, dialkyl peroxides), PERHEXA V and PERHEXA 22 (hereinbefore, peroxy ketals), and PERBUTYL Z and PERBUTYL A (hereinbefore, peroxy esters) manufactured by NOF CORPORATION; and LUPEROX TAH and LUPEROX TBH (hereinbefore, hydroperoxides), and LUPEROX DTA (hereinbefore, dialkyl peroxides) manufactured by ARKEMA Yoshitomi, Ltd.

These thermal radical polymerization initiators (B) can be used alone as one kind or can be used in combination of two or more kinds.

Although the content of the thermal radical polymerization initiator (B) in the resin composition of the present embodiment is not particularly limited, it is preferably 0.005 parts by mass or more and 5 parts by mass or less based on 100 parts by mass of the total amount of the radical polymerizable compound (C) from the viewpoint of imparting sufficient curability to the radical polymerizable compound (C), and it is more preferably 0.05 parts by mass or more and 3 parts by mass or less from the viewpoint of suppressing volatile portions and suppressing voids during the curing.

[I-3. Radical Polymerizable Compound (C)]

The radical polymerizable compound (C) according to the present embodiment is not particularly limited as long as it is a compound by which polymerization progresses through the radical polymerization reaction. Above all, it is preferably a compound containing at least one functional group selected from the group consisting of a maleimide group, a (meth)acryloyl group, a propenyl group and a vinyl group, and from the viewpoint of insulation reliability and heat resistance, it is more preferably a compound containing a maleimide group.

The compound containing a maleimide group is not particularly limited as long as it is a compound having one or more maleimide groups in the molecule. Examples thereof include, for example, N-phenylmaleimide, N-hydroxyphenylmaleimide, bis(4-maleimidophenyl)methane, 4,4-diphenylmethanebismaleimide, bis(3,5-dimethyl-4-maleimidophenyl)methane, bis(3-ethyl-5-methyl-4-maleimidophenyl)methane, bis(3,5-diethyl-4-maleimidophenyl)methane, phenylmethanemaleimide, o-phenylenebismaleimide, m-phenylenebismaleimide, p-phenylenebismaleimide, o-phenylenebiscitraconimide, m-phenylenebiscitraconimide, p-phenylenebiscitraconimide, 2,2-bis(4-(4-maleimidophenoxy)-phenyl)propane, 3,3-dimethyl-5,5-diethyl-4,4-diphenylmethanebismaleimide, 4-methyl-1,3-phenylenebismaleimide, 1,6-bismaleimido-(2,2,4-trimethyl)hexane, 4,4-diphenyl ether bismaleimide, 4,4-diphenyl sulfone bismaleimide, 1,3-bis(3-maleimidophenoxy)benzene, 1,3-bis(4-maleimidophenoxy)benzene, 4,4-diphenylmethanebiscitraconimide, 2,2-bis[4-(4-citraconimidophenoxy)phenyl]propane, bis(3,5-dimethyl-4-citraconimidophenyl)methane, bis(3-ethyl-5-methyl-4-citraconimidophenyl)methane, bis(3,5-diethyl-4-citraconimidophenyl)methane, polyphenylmethanemaleimide, a novolac-based maleimide compound, a biphenyl aralkyl-based maleimide compound, 2,2-bis(4-(4-maleimidophenoxy)phenyl)propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, N-phenylmaleimide, a maleimide compound represented by the following formula (3), a maleimide compound represented by the following formula (4) and a maleimide compound represented by the following formula (5). These compounds that have a maleimide group can be used alone as one kind or can be used in combination of two or more kinds. Among the above, from the viewpoint of solubility in an organic solvent, 2,2-bis(4-(4-maleimidophenoxy)phenyl)propane, a maleimide compound represented by the following formula (3) and a maleimide compound represented by the following formula (4) and a maleimide compound represented by the following formula (5) are preferable.

Note that these maleimide compounds may also be compounded in the form of a prepolymer obtained by polymerizing them or a prepolymer obtained by polymerizing them with another compound such as an amine compound, and these compounds can be used alone as one kind or can be used in combination of two or more kinds.

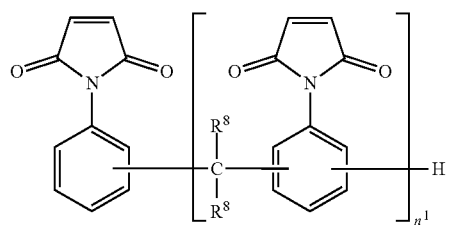

(3)

In the formula (3), each $R^8$ independently represents a hydrogen atom or a methyl group. In addition, in the formula (3), $n^1$ represents an integer of 1 or more and the upper limit value of $n^1$ is normally 10. From the viewpoint of solubility in an organic solvent, it is preferably 7.

Note that the formula (3) may be a mixture of compounds with different $n^1$.

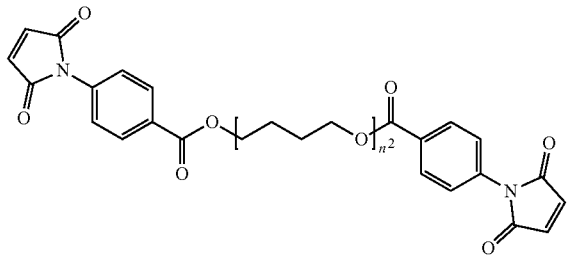

(4)

In the formula (4), the average value of $n^2$ is in the range of 7 or more and 30 or less.

Note that the formula (4) may be a mixture of compounds with different $n^2$.

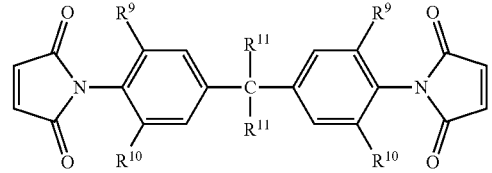

(5)

In the formula (5), $R^9$ and $R^{10}$ each independently represent a hydrogen atom, a methyl group or an ethyl group.

In the formula (5), each $R^{11}$ independently represents a hydrogen atom or a methyl group.

In addition, from the viewpoint of ensuring solubility in an organic solvent and flexibility, the radical polymerizable compound (C) in the present embodiment contains a maleimide compound represented by the above formula (4), and along with this, it is more preferable that at least one or more maleimide compounds selected from the group consisting of 2,2-bis(4-(4-maleimidophenoxy)phenyl)propane, a maleimide compound represented by the above formula (3) and a maleimide compound represented by the above formula (5) be used in combination.

For the compound containing a maleimide group, those commercially available may be used, and examples thereof include, for example, BMI-2300 (a maleimide compound wherein all $R^8$ in the above formula (3) is a hydrogen atom and $n^1$ is 1 or more and 3 or less) manufactured by Daiwa Kasei Industry Co., LTD.; and BMI-70 (a maleimide compound wherein $R^9$ in the above formula (5) is a methyl group; $R^{10}$ is an ethyl group; and $R^{10}$ is a hydrogen atom, bis-(3-ethyl-5-methyl-4-maleimidophenyl)methane), BMI-80 (2,2-bis(4-(4-maleimidophenoxy)phenyl)propane), BMI-1000P (a maleimide compound wherein $n^2$ in the above formula (4) is 14 (average value)) and BMI-650P (a maleimide compound wherein $n^2$ in the above formula (4) is 9 (average value)) manufactured by K-I Chemical Industry Co., LTD.

The compound containing a (meth)acryloyl group is not particularly limited as long as it is a compound having one or more (meth)acryloyl groups in the molecule. Examples thereof include, for example, methyl (meth)acrylate, ethyl (meth)acrylate, isopropyl (meth)acrylate, isobutyl (meth)acrylate, ethylene glycol di(meth)acrylate, diethylene glycol di(meth)acylate, trimethylolpropane tri(meth)acrylate, tetramethylolmethane tetra(meth)acrylate, 2-hydroxy-1,3-di(meth)acryloxypropane, 2,2-bis[4-((meth)acryloxymethoxy)phenyl]propnae, 2,2-bis[4-((meth)acryloxypolyethoxy)phenyl]propane, dicyclopentenyl (meth) acrylate, tricyclodecanyl (meth)acrylate, tris((meth)acryloyloxyethyl)isocyanurate and urethane (meth)acrylate. These compounds that contain a (meth)acryloyl group can be used alone as one kind or can be used in mixture of two or more kinds, as appropriate.

The compound containing a propenyl group is not particularly limited as long as it is a compound having one or more propenyl groups in the molecule. Examples thereof include, for example, a monofunctional propenyl compound such as propenylbenzene, propenylnaphthalene, propenylanthracene, propenylphenol and o-propenylphenoxybenzene; and bispropenylphenyl ether, 2,2-bis[4-(o-propenylphenoxy)phenyl]propane, bis[4-(o-propenylphenoxy)phenyl] ether, bis[4-(o-propenylphenoxy)phenyl]sulfone, 4,4'-bis(o-propenylphenoxy)benzophenone, 2,2-bis[4-(o-propenylphenoxy)phenyl]nonane, 2,2-bis[3-tert-butyl-4-(o-propenylphenoxy)phenyl]propane, 2,2-bis[3-sec-butyl-4-(o-propenylphenoxy)phenyl]propane, 1,1-bis[4-(o-propenylphenoxy)phenyl]decane, 1,1-bis[2-methyl-4-(o-propenylphenoxy)-5-tert-butylphenyl]-2-methylpropane, 4,4'-cyclohexylidene-bis[1-(o-propenylphenoxy)-2-(1,1-dimethylethyl)benzene], 4,4'-methylene-bis[1-(o-propenylphenoxy)-2,6-bis(1,1-dimethylethyl)benzene], 4,4'-methylene-bis[1-(o-propenylphenoxy)-2,6-di-sec-butylbenzene], 4,4'-cyclohexylidene-bis[1-(o-propenylphenoxy)-2-cyclohexylbenzene], 4,4'-methylene-bis[1-(o-propenylphenoxy)-2-nonylbenzene], 4,4'-(1-methylethylidene)-bis[1-(o-propenylphenoxy)-2,6-bis(1,1-dimethylethyl)benzene, 4,4'-(2-ethylhexylidene)-bis[1-(o-propenylphenoxy)-benzene], 4,4'-(1-methylheptylidene)-bis[1-(o-propenylphenoxy)-benzene], 4,4'-cyclohexylidene-bis[1-(o-propenylphenoxy)-3-methylbenzene], 2,2-bis[4-(o-propenylphenoxy)phenyl]-propane, 2,2-bis[4-(o-propenylphenoxy)phenyl]-hexafluoropropane, 2,2-bis[3-methyl-4-(o-propenylphenoxy)phenyl]-propane, 2,2-bis[3-methyl-4-(o-propenylphenoxy)phenyl]-hexafluoropropane, 2,2-bis[3,5-dimethyl-4-(o-propenylphenoxy)phenyl]-propane, 2,2-bis[3,5-dimethyl-4-(o-propenylphenoxy)phenyl]-hexafluoropropane, 2,2-bis[3-ethyl-4-(o-propenylphenoxy)phenyl]-propane, 2,2-bis[3-ethyl-4-(o-propenylphenoxy)phenyl]-hexafluoropropane, bis[3-methyl-(o-propenylphenoxy)phenyl]-methane, bis[3,5-dimethyl-(o-propenylphenoxy)phenyl]-methane, bis[3-ethyl-(o-propenylphenoxy)phenyl]-methane, 3,8-bis[4-(o-propenylphenoxy)phenyl]-tricyclo-[5,2,1,0$^{2-6}$]decane, 4,8-bis[4-(o-propenylphenoxy)phenyl]-tricyclo-[5,2,1,0$^{2-6}$]decane, 3,9-bis[4-(o-propenylphenoxy)phenyl]-tricyclo-[5,2,1,0$^{2-6}$]decane, 4,9-bis[4-(o-propenylphenoxy)phenyl]-tricyclo-[5,2,1,0$^{2-6}$]decane, 1,8-bis[4-(o-propenylphenoxy)phenyl]-menthane, 1,8-bis[3-methyl-4-(o-propenylphenoxy)phenyl]-menthane and 1,8-bis[3,5-dimethyl-4-(o-propenylphenoxy)phenyl]-menthane. These compounds that contain a propenyl group can be used alone as one kind or can be used in mixture of two or more kinds, as appropriate.

The compound containing a vinyl group is not particularly limited as long as it is a compound having one or more vinyl groups in the molecule. Examples thereof include, for example, ethyl vinyl ether, propyl vinyl ether, hydroxyethyl vinyl ether, ethylene glycol divinyl ether, and a vinyl ether of a bifunctional phenylene ether oligomer that has a vinyl group, and these compounds that contain a vinyl group can be used alone as one kind or can be used in mixture of two or more kinds, as appropriate.

For the resin composition in the present embodiment, without particular limitations, from the viewpoints of good flux activity and of ensuring the strength of the film, the total amount of the radical polymerizable compound (C) is preferably 50 parts by mass or more and 200 parts by mass or less based on 20 parts by mass of the chelating flux agent (A), and more preferably 80 parts by mass or more and 150 parts by mass or less from the viewpoint of obtaining good film formability.

Above all, it is preferable that the compound containing a maleimide group be contained in the radical polymerizable compound (C) at 50 to 100%.

From the viewpoint of having excellent flux activity, excellent flexibility and a low thermal expansion coefficient in a well balanced manner, the compound containing a maleimide group preferably contains a maleimide compound represented by the above formula (3) at 5 parts by mass or more and 50 parts by mass or less based on 100 parts by mass of the entire amount of the radical polymerizable compound (C), preferably contains a maleimide compound represented by the above formula (4) at 5 parts by mass or more and 70 parts by mass or less, preferably contains a maleimide compound represented by the above formula (5) at 5 parts by mass or more and 50 parts by mass or less, and preferably contains 2,2-bis(4-(4-maleimidophenoxy)phenyl)propane at 5 parts by mass or more and 50 parts by mass or less.

[I-4. Inorganic Filler (D)]

In the present embodiment, an inorganic filler (D) may be contained in order to improve burning resistance, to improve thermal conductivity and to reduce the thermal expansion coefficient. The type of the inorganic filler (D) is not particularly limited, but examples thereof include, for example, silica such as fused silica; an aluminum compound such as boehmite, aluminum hydroxide and alumina; a magnesium compound such as magnesium oxide and magnesium hydroxide; a calcium compound such as calcium carbonate; a molybdenum compound such as molybdenum oxide and zinc molybdate; a talc such as natural talc and calcined talc; mica; and a glass such as short fibrous glass, spherical glass and fine powder glass (for example, E glass, T glass, D glass). These inorganic fillers (D) can be used alone as one kind or can be used in combination of two or more kinds.

Among the above, from the viewpoint of improving the burning resistance and reducing the thermal expansion coefficient of the resin composition, as the inorganic filler (D), silica is preferable, and among the silica, fused silica is still more preferable. Examples of the fused silica include, for example, SFP-120MC manufactured by Denka Company Limited; and SC1050, SC2050, SE1030, SE1050 and SE2050 manufactured by Admatechs Company Limited. In addition, when the resin composition is used for applications of underfill materials, it is preferable to use a silica with a low alpha beam grade, and examples thereof include, for example, SV-EM1 and SX-EM1 manufactured by Admatechs Company Limited.

Although the average particle diameter of the inorganic filler (D) is not particularly limited, from the viewpoint of coping with narrower electrode pitch arranged on the chip and narrower gap between the electrodes when the resin composition of the present embodiment is used as a pre-applied underfill material, it is preferably 3 μm or less, and in the case where the pitch between electrodes is 60 μm or less, the average particle diameter is more preferably 1 μm or less.

Note that the "average particle diameter" of the inorganic filler (D) as used herein means the median diameter of the inorganic filler (D). Here, the median diameter means a certain particle diameter such that, when the particle size distribution of powder is divided into two parts based on that particle diameter, the number or mass of particles on the side of larger particle diameter and the number or mass of particles on the side of smaller particle diameter each account for 50% of the entire powder. The average particle diameter (median diameter) of the inorganic filler (D) is measured according to the wet laser diffraction scattering method.

In the present embodiment, when the inorganic filler (D) is used, its content is preferably 300 parts by mass or less and more preferably 200 parts by mass or less based on 100 parts by mass of the total amount of the radical polymerizable compound (C) in the resin composition from the viewpoint of ensuring the flowability of a pre-applied underfill material, in the joint process while improving the burning resistance and reducing the thermal expansion coefficient of the resin composition. In addition, the content of the inorganic filler (D) is preferably 10 parts by mass or more and still more preferably 50 parts by mass or more based on 100 parts by mass of the content described above. Note that, when two or more kinds of inorganic fillers (D) are used in combination, it is preferable that their total amount satisfy the content range described above.

[I-5. Flexibility Imparting Component (E)]

Although the flexibility imparting component (E) in the present embodiment is not particularly limited, examples thereof include, for example, a thermoplastic polymer compound such as a polyimide, a polyamide imide, a polystyrene, a polyolefin, a styrene-butadiene rubber (SBR), an isoprene rubber (IR), a butadiene rubber (BR), an acrylonitrile-butadiene rubber (NBR), a polyurethane, a polypropylene, a (meth)acrylic oligomer, a (meth)acrylic polymer, a silicone resin and a phenoxy resin. These flexibility imparting components (E) can be used alone as one kind or can be used in combination of two or more kinds.

Among the above, as the flexibility imparting component (E), at least one selected from the group consisting of a (meth)acrylic oligomer and a (meth)acrylic polymer is preferable from the viewpoint of solubility in an organic solvent that is used upon producing the resin composition, compatibility with the maleimide compound, controllability of the melt viscosity of the resin composition, and impartment of flexibility. Examples of the (meth)acrylic oligomer and the (meth)acrylic polymer include, for example, the "ARUFON" series from Toagosei Co., Ltd.; the "ACTFLOW" series from Soken Chemical & Engineering Co., Ltd.; the "PARACRON" series from Negami Chemical Industrial Co., Ltd.; and the "KURARITY" series from KURARAY CO., LTD.

Although the molecular weight of the flexibility imparting component (E) is not limited, the weight average molecular weight is preferably 1,000 or more from the viewpoint of imparting flexibility to the resin composition, and is more preferably 2,000 or more from the viewpoint of imparting resilience and good tenacity in the cured product. In addition, when the resin composition is used as a pre-applied underfill material, in order to obtain a joint with a better and more stable shape without entrapment of the resin composition into the metal joint, it is preferable to control the melt viscosity of the resin composition at a low level and to ensure the flowability of the resin composition upon the joint process. From such a viewpoint, the weight average molecular weight of the flexibility imparting component (E) is preferably 1,000,000 or less, more preferably 800,000 or less, still more preferably 100,000 or less, and from the viewpoint of solvent solubility, even more preferably 10,000 or less. By using a flexibility imparting component (E) having a weight average molecular weight in such a preferable range, both flexibility of the resin composition and joinability in the case of being used as a pre-applied underfill material can be achieved.

In the present embodiment, when the flexibility imparting component (E) is used, its content is preferably 100 parts by mass or less, more preferably 50 parts by mass or less, and still more preferably 30 parts by mass or less based on 100 parts by mass of the total amount of the above radical polymerizable compound (C) in the resin composition from the viewpoint of controllability of melt viscosity. In addition, the content of the flexibility imparting component (E) in the resin composition is preferably 1 part by mass or more and more preferably 5 parts by mass or more based on 100 parts by mass of the total amount of the above radical polymerizable compound (C) in the resin composition from the viewpoint of achieving action effects caused by the use of the flexibility imparting component (E) more effectively and reliably. Note that, when two or more kinds of flexibility imparting components (E) are used in combination, it is preferable that their total amount be within the content range described above.

[I-6. Additional Component]

The resin composition of the present embodiment may contain, in addition to the chelating flux agent (A), the thermal radical polymerization initiator (B), the radical polymerizable compound (C), the inorganic filler (D) and the flexibility imparting component (E), one kind of or two or more kinds of additional components.

For example, the resin composition of the present embodiment may contain a silane coupling agent for the purpose of improving moisture absorption heat resistance and improving the adhesiveness between the chip and the resin composition. The silane coupling agent is not limited as long as it is a silane coupling agent that is generally used for surface treatment of inorganic matter and that has low reactivity with the chelating flux agent (A). Examples thereof include, for example, a vinylsilane-based silane coupling agent (for example, γ-methacryloxypropyltrimethoxysilane), a phenylaminosilane-based silane coupling agent (for example, N-phenyl-3-aminopropyltriethoxysilane), a phenylsilane-based silane coupling agent, and an imidazolesilane-based silane coupling agent. These silane coupling agents can be used alone as one kind or can be used in combination of two or more kinds.

When the silane coupling agent is used, the amount thereof to be added is not limited. However, its content is preferably 0.05 parts by mass or more and 20 parts by mass or less and more preferably 0.1 parts by mass or more and 15 parts by mass or less based on 100 parts by mass of the total amount of the above radical polymerizable compound (C) in the resin composition from the viewpoint of improving moisture absorption heat resistance and reducing volatilization volume upon the flip chip bonding. Note that, when two or more kinds of silane coupling agents are used in combination, it is preferable that their total amount be within the content range described above.

The resin composition of the present embodiment may contain a wetting and dispersing agent for the purpose of, for example, improving the producibility of a laminate. The wetting and dispersing agent is not limited as long as it is a wetting and dispersing agent that is used in general for a paint and the like. Examples thereof include, for example, Disperbyk-110, 111, 180 and 161, and BYK-W996, W9010 and W903 manufactured by BYK Japan KK. These wetting and dispersing agents can be used alone as one kind or can be used in combination of two or more kinds.

When the wetting and dispersing agent is used, its content in the resin composition is not limited, but the ratio of the wetting and dispersing agent is preferably 0.1 parts by mass or more and 5 parts by mass or less and more preferably 0.5 parts by mass or more and 3 parts by mass or less based on 100 parts by mass of the radical polymerizable compound (C) from the viewpoint of improving the producibility of a laminate. Note that, when two or more kinds of wetting and dispersing agents are used in combination, it is preferable that their total amount be within the content range described above.

The resin composition of the present embodiment may contain a benzoxazine compound for the purpose of, for example, imparting adhesiveness. The benzoxazine compound is not particularly limited as long as it is publicly known as a compound in which ring opening polymerization progresses by heat and is generally used. Examples thereof include, for example, compounds represented by the following formula (6), the following formula (7) and the following formula (8).

a n-propyl group, an isopropyl group, a n-butyl group, a 2-butyl group, an isobutyl group, a tert-butyl group, a n-pentyl group, a 2-pentyl group, a tert-pentyl group, a 2-methylbutyl group, a 3-methylbutyl group, a 2,2-dimethylpropyl group, a n-hexyl group, a 2-hexyl group, a 3-hexyl group, a 2-methylpentyl group, a 3-methylpentyl group, a 4-methylpentyl group and a 2-methylpentan-3-yl group.

The cycloalkyl group is not particularly limited, and examples thereof include, for example, a cyclopropyl group, a cyclobutyl group, a cyclopentyl group and a cyclohexyl group.

The alkylene group is not particularly limited, and examples thereof include, for example, a linear alkylene group such as methylene, ethylene, trimethylene, tetramethylene, pentamethylene, hexamethylene, heptamethylene, octamethylene, nonamethylene, decamethylene, undecamethylene, dodecamethylene, tridecamethylene, tetradecamethylene, pentadecamethylene and hexadecamethylene groups; and a branched alkylene group such as methylethylene, methylpropylene, ethylethylene, 1,2-dimethylethylene, 1,1-dimethylethylene, 1-ethylpropylene, 2-ethylpropylene, 1,2-dimethylpropylene, 2,2-dimethylpropylene, 1-propylpropylene, 2-propylpropylene, 1-methyl-1-ethylpropylene, 1-methyl-2-ethyl-propylene, 1-ethyl-2-methylpropylene, 2-methyl-2-ethyl-propylene, 1-methylbutylene, 2-methylbutylene, 3-methylbutylene, 2-ethylbutylene, methylpentylene, ethylpentylene, methylhexylene, methylheptylene, methyloctylene, methylnonylene, methyldecylene, methylundecylene, methyldodecylene, methyltetradecylene and methyloctadecylene groups.

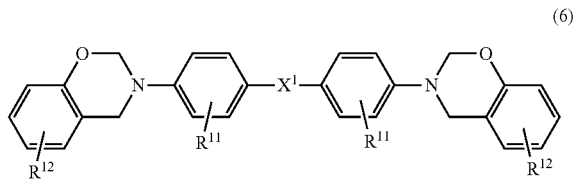

(6)

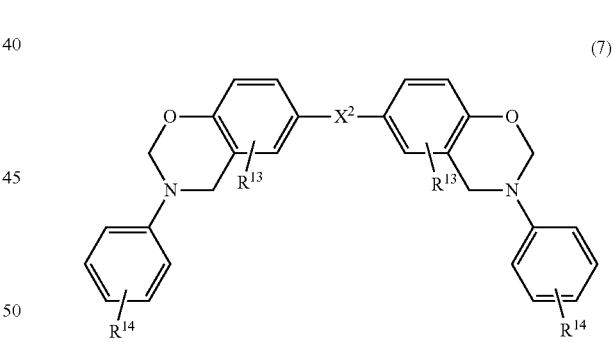

(7)

In the compound represented by the formula (6), each $R^{11}$ independently represents a hydrogen atom, an aryl group, an aralkyl group, an allyl group, an alkyl group or a cycloalkyl group; each $R^{12}$ independently represents a hydrogen atom, an aryl group, an aralkyl group, an allyl group, an alkyl group or a cycloalkyl group; $X^1$ represents an alkylene group, a group represented by the following formula (9), a group represented by the formula "—$SO_2$—", a group represented by the formula "—CO—", an oxygen atom or a single bond.

Although the aryl group is not particularly limited, examples thereof include, for example, a phenyl group, a naphthyl group, an anthryl group, a phenanthrenyl group and a biphenyl group.

Although the aralkyl group is not particularly limited, examples thereof include, for example, a benzyl group and a phenethyl group.

The alkyl group is not particularly limited, and examples thereof include, for example, a methyl group, an ethyl group, In the compound represented by the formula (7), each $R^{13}$ independently represents a hydrogen atom, an aryl group, an aralkyl group, an allyl group, an alkyl group or a cycloalkyl group; each $R^{14}$ independently represents a hydrogen atom, an aryl group, an aralkyl group, an allyl group, an alkyl group or a cycloalkyl group; $X^2$ represents an alkylene group, a group represented by the following formula (9), a group represented by the formula "—$SO_2$—", a group represented by the formula "—CO—", an oxygen atom or a single bond.

For the aryl group, the aralkyl group, the alkyl group, the cycloalkyl group and the alkylene group, they are as described above.

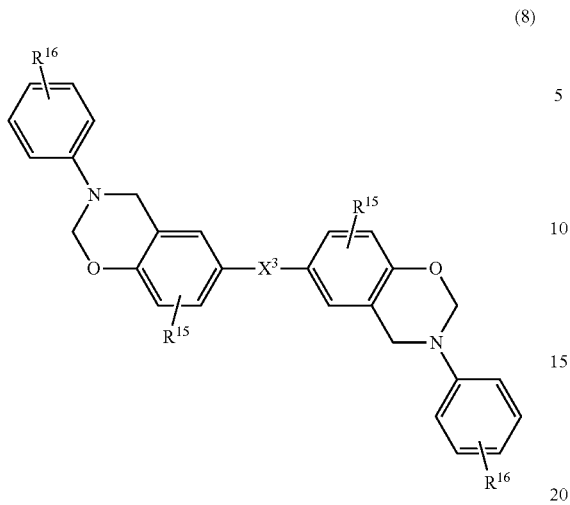

(8)

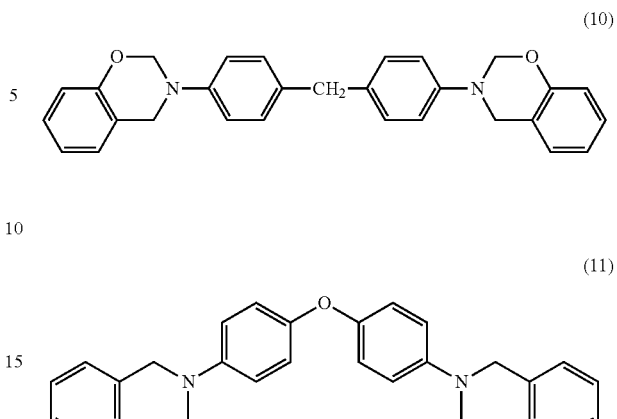

(10)

(11)

In the compound represented by the formula (8), each $R^{15}$ independently represents a hydrogen atom, an aryl group, an aralkyl group, an allyl group, an alkyl group or a cycloalkyl group; each $R^{16}$ independently represents a hydrogen atom, an aryl group, an aralkyl group, an allyl group, an alkyl group or a cycloalkyl group; $X^3$ represents an alkylene group, a group represented by the following formula (9), a group represented by the formula "—$SO_2$—", a group represented by the formula "—CO—", an oxygen atom or a single bond.

For the aryl group, the aralkyl group, the alkyl group, the cycloalkyl group and the alkylene group, they are as described above.

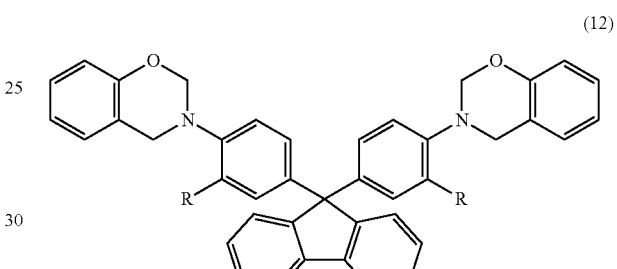

(12)

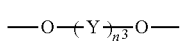

(9)

In the compound represented by the formula (9), Y is an alkylene group or a hydrocarbon group having 6 or more and 30 or less carbon atoms and having an aromatic ring; and $n^3$ represents an integer of 1 or more.

For the alkylene group, it is as described above.

Although the hydrocarbon group having 6 or more and 30 or less carbon atoms and having an aromatic ring is not particularly limited, examples thereof include, for example, a divalent group obtained by removing two hydrogen atoms from the nucleus of a compound with aromaticity such as benzene, biphenyl, naphthalene, anthracene, fluorene, phenanthrene, indacene, terphenyl, acenaphthylene and phenalene.

Specific examples thereof include a compound represented by the following formula (10), a compound represented by the following formula (11), a compound represented by the following formula (12), a compound represented by the following formula (13), a compound represented by the following formula (14), a compound represented by the following formula (15) and a compound represented by the following formula (16). These benzoxazine compounds can be used alone as one kind or can be used in combination of two or more kinds.

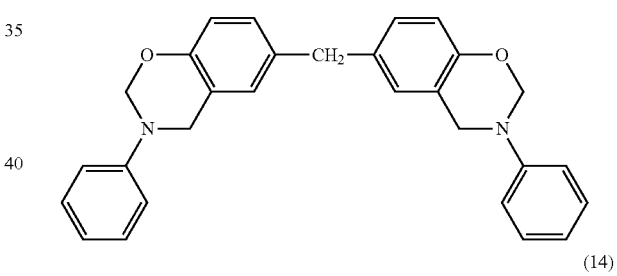

(13)

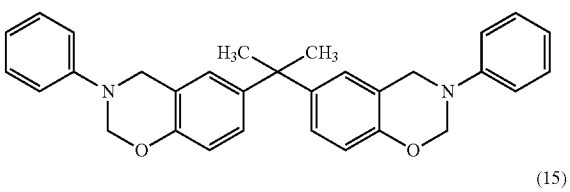

(14)

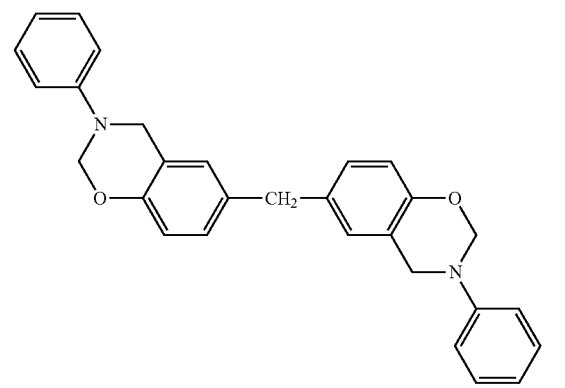

(15)

-continued (16)

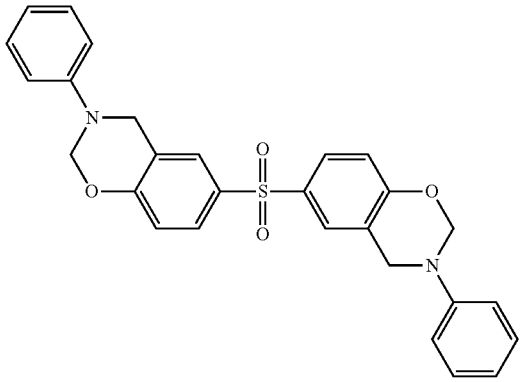

In the present embodiment, when a benzoxazine is used, its content is not limited, but from the viewpoint of ensuring sufficient adhesiveness to the chip, the resin composition preferably contains the benzoxazine compound at 5 parts by mass or more and 60 parts by mass or less, and more preferably contains it at 25 parts by mass or more and 45 parts by mass or less based on 100 parts by mass of the total amount of the radical polymerizable compound (C). Note that, when two or more kinds of benzoxazine compounds are used in combination, it is preferable that their total amount be within the content range described above.

The resin composition of the present embodiment may contain a variety of additives for various purposes in a range in which the expected characteristics are not impaired. Examples of the additive include, for example, an ultraviolet absorbing agent, an antioxidant, a fluorescent brightening agent, a dye, a pigment, a thickening agent, a lubricating agent, a defoaming agent, a leveling agent, a brightening agent and a flame retardant. These additives can be used alone as one kind or can be used in combination of two or more kinds.

In the resin composition of the present embodiment, the contents of the additional additives are not particularly limited, but they each are normally 0.01 parts by mass or more and 10 parts by mass or less based on 100 parts by mass of the total amount of the above radical polymerizable compound (C) in the resin composition.

The resin composition of the present embodiment is prepared by mixing the chelating flux agent (A), the thermal radical polymerization initiator (B), the radical polymerizable compound (C), the inorganic filler (D), the flexibility imparting component (E) and an additional component. If required, the resin composition may be in the form of a varnish formed by dissolving or dispersing these components in an organic solvent. The varnish of the resin composition of the present embodiment can be suitably used as a varnish upon fabricating a laminate of the present embodiment, which will be described below. The organic solvent is not limited as long as it can suitably dissolve or disperse each of the components described above and does not impair the expected characteristics of the resin composition of the present embodiment. Examples of the organic solvent include, for example, an alcohol such as methanol, ethanol and propanol; a ketone such as acetone, methyl ethyl ketone and methyl isobutyl ketone; an amide such as dimethylacetamide and dimethylformamide; and an aromatic hydrocarbon such as toluene and xylene. These organic solvents can be used alone as one kind or can be used in combination of two or more kinds.

The resin composition of the present embodiment is excellent in flux activity, flexibility and insulation reliability. In addition, by coating a supporting material with the resin composition, a laminate having a resin layer that is excellent in flux activity can be provided. When the resin composition of the present embodiment is used as a pre-applied underfill material for use in the form of a laminate, it is not only excellent in flux activity, flexibility and insulation reliability, but also excellent in joinability in the flip chip bonding, moisture absorption heat resistance, adhesiveness to the chip and the like, which can also demonstrate other suitable effects. As described above, the resin composition of the present embodiment has a variety of excellent features, and in particular, it can achieve flux activity, flexibility and insulation reliability at a high level. Therefore, the resin composition of the present embodiment is extremely useful as an underfill material.

[II. Laminate, Semiconductor Wafer with Resin Composition Layer Fabricated by Using Laminate, Substrate with Resin Composition Layer Fabricated by Using Laminate, and Semiconductor Device]

The laminate, semiconductor wafer with a resin composition layer, substrate with a resin composition layer and semiconductor device of the present embodiment are all formed by using the above resin composition of the present embodiment.

[II-1. Laminate]

In the laminate of the present embodiment, the above resin composition of the present embodiment is attached to a supporting material. As the supporting material, there is no particular limitation, but a polymer film can be used. Examples of the material of the polymer film include, for example, a film containing at least one or more resins selected from the group consisting of a polyvinyl chloride, a polyvinylidene chloride, a polybutene, a polybutadiene, a polyurethane, an ethylene-vinyl acetate copolymer, a polyester such as a polyethylene terephthalate, a polyethylene naphthalate and a polybutylene terephthalate, a polyethylene, a polypropylene, an ethylene-propylene copolymer, a polymethylpentene, a polyimide and a polyamide; and a mold releasing film formed by coating the surface of these films with a mold releasing agent. Among the above, in particular, a polyester, a polyimide and a polyamide are preferable, and even among them, a polyethylene terephthalate, which is one kind of polyester, is particularly preferable.

Although the thickness of the supporting material of the present embodiment is not limited, it is preferably 10 µm or more and 100 µm or less from the viewpoint of producibility of the laminate, for example, stability of the coating thickness in the case of coating the supporting material with the resin composition. In addition, also from the viewpoint of conveyance properties of the laminate, the thickness of the supporting material is preferably 10 µm or more and 100 µm or less. Also, the lower limit of the thickness is still more preferably 12 µm or more, particularly preferably 25 µm or more, and even more preferably 30 µm or more from the viewpoint of ensuring the yield upon producing the laminate. In addition, the upper limit of the thickness is preferably 80 µm or less and still more preferably 50 mm or less from the viewpoint of production costs of the laminate because the supporting material is peeled in the middle of the process and is not present in the end as a constituent member of the semiconductor device.

The method for producing the laminate of the present embodiment by forming a layer composed of the resin composition of the present embodiment (hereinafter, also simply referred to as a "resin composition layer") on the supporting material described above is not limited. Examples of such a production method include an approach in which the surface of the supporting material described above is coated with a varnish formed by dissolving or dispersing the resin composition of the present embodiment in an organic solvent, and dried under heating and/or reduced pressure, and the solvent is removed to solidify the resin composition of the present embodiment, thereby forming the resin composition layer. The drying conditions are not particularly limited, but the drying is carried out such that the content ratio of the organic solvent to the resin composition layer is usually 10% by mass or less, and preferably 5% by mass or less based on the total amount of the resin composition layer (100% by mass). Conditions for achieving the drying vary depending on the type of the organic solvent in the varnish and the amount to be compounded. However, for example, for a resin composition containing the chelating flux agent (A), the thermal radical polymerization initiator (B) and the radical polymerizable compound (C), if a varnish contains methyl ethyl ketone at 30 parts by mass or more and 60 parts by mass or less based on 100 parts by mass of the total amount of the above components, the varnish is generally dried under heating conditions of 90° C. or higher and 160° C. or lower at 1 atm for approximately 1 minute or longer and 10 minutes or shorter. In particular, regarding the heating temperature, attention must be paid to deactivation by oxygen or volatilization of the thermal radical polymerization initiator (B). When the varnish of the present embodiment is heated, decomposition of the thermal radical polymerization initiator (B) progresses, the generated active radicals are deactivated by oxygen in the atmosphere, or the thermal radical polymerization initiator and its decomposition products are volatilized. As such, the number of radicals that contribute to the polymerization of the radical polymerizable compound (C) is decreased, and there is a concern that the curing reaction of the resin composition does not progress in the flip chip bonding. Therefore, in the resin composition of the present embodiment, it is suitable to use the thermal radical polymerization initiator (B) having a 10 hour half-life period temperature in the temperature range at or above the drying temperature of the varnish. Although the thickness of the resin composition layer in the laminate of the present embodiment is not limited, it is suitably in the range of m or more and 500 m or less from the viewpoint of removing light volatile portions such as the solvent in a better manner upon drying the resin composition layer and from the viewpoint of achieving functions as the laminate more effectively and reliably.

[II-2. Semiconductor Wafer with Resin Composition Layer Fabricated by Using Laminate and Substrate with Resin Composition Layer Fabricated by Using Laminate]

The semiconductor wafer with a resin composition layer of the present embodiment is formed from the above laminate of the present embodiment and a semiconductor wafer, and the substrate with a resin composition layer of the present embodiment is formed from the above laminate of the present embodiment and a substrate.

The method for fabricating the semiconductor wafer with a resin composition layer of the present embodiment is not limited, but for example, it is obtained by pasting the semiconductor wafer and the resin composition layer together such that the resin composition layer of the laminate of the present embodiment and the surface of the semiconductor wafer on which the electrodes have been formed, that is, the surface on which the joint with the substrate will take place, face each other. In addition, the method for fabricating the substrate with a resin composition layer of the present embodiment is not limited, but for example, it is obtained by pasting the substrate and the resin composition layer together such that the resin composition layer of the present embodiment in the laminate of the present embodiment and the surface of the substrate on which chips are mounted face each other.

Although the method for pasting the laminate of the present embodiment and the semiconductor wafer or substrate together is not particularly limited, a vacuum pressing laminator can be suitably used. In this case, a method is preferable in which pressure is applied to the laminate of the present embodiment via an elastic body such as rubber, thereby pasting the laminate and the semiconductor wafer or substrate together. The lamination conditions are not particularly limited as long as they are conditions generally used in the art, and for example, the lamination is performed at a temperature of 10° C. or higher and 140° C. or lower, with a contact pressure in the range of 1 kgf/cm$^2$ to 11 kgf/cm$^2$, and under an atmospheric reduced pressure of 20 hPa or less. Subsequently to the lamination step, smoothing of the pasted laminate may be performed through hot pressing with metal plates. The above lamination step and the smoothing step can be performed sequentially with a commercially available vacuum pressing laminator. In the laminate stuck to the semiconductor wafer or substrate, removal of the supporting material is performed before the flip chip bonding in any case.

[II-3. Semiconductor Device]

The semiconductor device of the present embodiment contains the semiconductor wafer with a resin composition layer of the present embodiment and/or the substrate with a resin composition layer of the present embodiment, and is constituted with the resin composition of the present embodiment, a chip, a substrate and the like. Although the method for producing the semiconductor device of the present embodiment is not limited, and examples thereof include, for example, an approach in which the semiconductor wafer with a resin composition layer of the present embodiment is thinned with a grinding means and is divided into individual pieces with a dicing saw to make chips with the resin composition layer, which are then mounted on the substrate. In addition, a chip may be mounted on the substrate with a resin composition layer of the present embodiment. In the method for mounting the chip with the resin composition layer on the substrate and the method for mounting a semiconductor chip on the substrate with the resin composition layer, a flip chip bonder compatible with the thermocompression bonding method can be suitably used. In addition, although the case in which the chip is mounted on the substrate in the form of flip chip bonding is described for convenience in the present embodiment, the object to which the resin composition of the present embodiment is applied while mounting the chip in the form of flip chip bonding does not need to be a substrate. For example, the resin composition of the present embodiment may be used for a joint between a semiconductor wafer and a chip upon mounting the chip on the semiconductor wafer or for a joint between chips of a chip laminate in which inter-chip connection is formed via TSV (Through Silicon Via), and in any case, the superiority according to the present embodiment can be obtained.

EXAMPLES

Hereinafter, the present invention will be described in detail with reference to Examples and Comparative Examples, but the present invention is not limited to these Examples in any way.

1. Evaluation of chelating flux agent

(1) Evaluation objects

In order to evaluate a variety of characteristics of the chelating flux agent alone, four kinds of the following chelating flux agents were used as evaluation objects, and the results are shown in Table 1.

(i) N,N'-bis(salicylidene)-1,2-propanediamine (melting point: 45° C., molecular weight: 282, manufactured by Tokyo Kasei Kogyo Co., Ltd.)

(ii) N,N'-bis(salicylidene)ethylenediamine (melting point: 126° C., molecular weight: 268, manufactured by Tokyo Kasei Kogyo Co., Ltd.)

(iii) N,N'-bis(salicylidene)-1,3-propanediamine (melting point: 53° C., molecular weight: 282, manufactured by Tokyo Kasei Kogyo Co., Ltd.)

(iv) N,N'-bis(salicylidene)-1,2-phenylenediamine (melting point: 164° C., molecular weight: 316, manufactured by Tokyo Kasei Kogyo Co., Ltd.)

(2) Solder wettability test

Chelating flux agents (i) to (iv) were scattered on the glossy surface of an electrolytic copper foil with a thickness of 12 μm (3EC-III, manufactured by MITSUI MINING & SMELTING CO., LTD.), and a solder ball with a diameter of 0.5 mm (ECO SOLDER ball M705, SN-3.0 Ag-0.5 Cu alloy, manufactured by Senju Metal Industry Co., Ltd.) was placed thereon. This was heated on a hot plate kept at 235° C. for 1 minute to melt the solder on the copper foil, and then the solder was cooled at room temperature. The contact angle of the solder ball wetly spread on the copper foil was measured, thereby evaluating the flux activity. For the contact angle of the solder ball, the radius (a) of the solder ball melted and wetly spread on the copper foil and the height (b) of the solder ball were measured by using a digital microscope (KH-7700, manufactured by HIROX CO., LTD.) and the contact angle was calculated according to the following expression. Note that, for the radius (a) of the solder ball, a half value of the maximum diameter in the range where the solder was melted and wetly spread was used. In addition, for the height (b) of the solder ball, the length of a line drawn perpendicularly to the copper foil surface from the apex of the melted solder was used.

$$\text{contact angle of solder ball} = 2 \arctan\{(b)/(a)\}$$

The chelating flux agent with a contact angle of the solder ball of less than 1.20 radians was described as A, and the chelating flux agent with a contact angle of 1.20 radians or more was described as C.

TABLE 1

|  | (i) | (ii) | (iii) | (iv) |
|---|---|---|---|---|
| Solder wettability test | A (0.90 rad) | A (0.90 rad) | A (0.96 rad) | A (1.03 rad) |

From Table 1, in the solder wettability test, good results were confirmed for all of (i) to (iv). In the following Examples, N,N'-bis(salicylidene)-1,2-propanediamine and N,N'-bis(salicylidene)-1,3-propanediamine were used as chelating flux agents.

2. Fabrication of Resin Compositions and Laminates

Example 1

A solution (20 parts by mass in terms of non-volatile portions) of N,N'-bis(salicylidene)-1,2-propanediamine (manufactured by Tokyo Kasei Kogyo Co., Ltd.) as the chelating flux agent (A) in methyl ethyl ketone (hereinafter, may be abbreviated as "MEK"); 0.5 parts by mass of dicumyl peroxide (manufactured by KISHIDA CHEMICAL Co., Ltd., 10 hour half-life period temperature: 116.4° C.) as the thermal radical polymerization initiator (B); a solution (8 parts by mass in terms of non-volatile portions) of a maleimide compound wherein all $R^8$ in the formula (3) is a hydrogen atom and $n^1$ is 1 or more and 3 or less (BMI-2300, manufactured by Daiwa Kasei Industry Co., LTD.) as the first radical polymerizable compound (C) in MEK; a solution (25 parts by mass in terms of non-volatile portions) of a maleimide compound (BMI-1000P, manufactured by K-I Chemical Industry Co., LTD.) as the second radical polymerizable compound (C) in MEK; a solution (16 parts by mass in terms of non-volatile portions) of bis-(3-ethyl-5-methyl-4-maleimidophenyl)methane (BMI-70, manufactured by K-I Chemical Industry Co., LTD.) as the third radical polymerizable compound (C) in MEK; a solution (16 parts by mass in terms of non-volatile portions) of 2,2-bis(4-(4-maleimidophenoxy)phenyl)propane (BMI-80, manufactured by K-I Chemical Industry Co., LTD.) as the fourth radical polymerizable compound (C) in MEK; 75 parts by mass of a slurry silica (SV-EM1, solid content 65%, average particle diameter: 0.3 m, manufactured by Admatechs Company Limited) as the first inorganic filler (D); 25 parts by mass of a slurry silica (SX-EM1, solid content 65%, average particle diameter: 0.3 m, manufactured by Admatechs Company Limited) as the second inorganic filler (D); 10 parts by mass of an acrylic polymer (US-6170, manufactured by Toagosei Co., Ltd.) as the flexibility imparting component (E); and further a solution (25 parts by mass in terms of non-volatile portions) of a benzoxazine (Pd type benzoxazine, manufactured by SHIKOKU CHEMICALS CORPORATION) as the adherence imparting component in MEK were mixed and stirred for 30 minutes by using a high speed stirring apparatus, thereby obtaining a varnish. With this varnish, a polyethylene terephthalate film having a thickness of 38 μm (TR1-38, manufactured by UNITIKA LTD.), the surface of which was coated with a mold releasing agent, was coated, and it was heated and dried at 100° C. for 5 minutes, thereby obtaining a laminate with the resin composition layer of the present invention having a thickness of 30 μm.

Example 2

A varnish was prepared in the same manner as in Example 1 except that the chelating flux agent (A) to be used was changed to a solution (20 parts by mass in terms of non-volatile portions) of N,N'-bis(salicylidene)-1,3-propanediamine (manufactured by Tokyo Kasei Kogyo Co., Ltd.) in MEK, thereby obtaining a laminate.

Example 3

A varnish was prepared in the same manner as in Example 1 except that the thermal radical polymerization initiator (B) to be used was changed to di(2-tert-butylperoxyisopropyl)benzene (PERBUTYL P, manufactured by NOF CORPORATION, 10 hour half-life period temperature: 119.2° C.) and the amount thereof to be used was changed to 0.5 parts by mass, thereby obtaining a laminate.

Example 4

A varnish was prepared in the same manner as in Example 1 except that the chelating flux agent (A) to be used was changed to a solution (20 parts by mass in terms of non-volatile portions) of N,N'-bis(salicylidene)-1,3-propanediamine (manufactured by Tokyo Kasei Kogyo Co., Ltd.) in MEK, and that the thermal radical polymerization initiator (B) to be used was changed to di(2-tert-butylperoxyisopropyl)benzene (PERBUTYL P, manufactured by NOF CORPORATION, 10 hour half-life period temperature: 119.2° C.) and the amount thereof to be used was changed to 0.5 parts by mass, thereby obtaining a laminate.

Example 5

A varnish was prepared in the same manner as in Example 1 except that the chelating flux agent (A) to be used was changed to a solution of N,N'-bis(salicylidene)-1,2-propanediamine (manufactured by Tokyo Kasei Kogyo Co., Ltd.) in MEK and the amount thereof to be used was changed to 60 parts by mass in terms of non-volatile portions, thereby obtaining a laminate.

Example 6

A varnish was prepared in the same manner as in Example 1 except that the thermal radical polymerization initiator (B) to be used was changed to 1,1-di(tert-hexylperoxy)cyclohexane (PERHEXA HC, manufactured by NOF CORPORATION, 10 hour half-life period temperature: 87.1° C.) and the amount thereof to be used was changed to 0.5 parts by mass, thereby obtaining a laminate.

Comparative Example 1

A varnish was prepared in the same manner as in Example 3 except that the chelating flux agent (A) was not used, thereby obtaining a laminate.

Comparative Example 2

A varnish was prepared in the same manner as in Example 1 except that the thermal radical polymerization initiator (B) was not used, and that the curing accelerator was changed to a solution (0.5 parts by mass in terms of non-volatile portions) of 2-phenyl-4-methylimidazole (manufactured by Tokyo Kasei Kogyo Co., Ltd.) in MEK, thereby obtaining a laminate.

Comparative Example 3

A solution (62 parts by mass in terms of non-volatile portions) of a bisphenol A-based epoxy compound (EXA-850CRP, epoxy group equivalence 171 g/eq., manufactured by DIC CORPORATION) in MEK; a solution (38 parts by mass in terms of non-volatile portions) of a novolac-based phenol compound (PHENOLITE KA-1163, hydroxy group equivalence 118 g/eq., manufactured by DIC CORPORATION) in MEK; a solution (20 parts by mass in terms of non-volatile portions) of N,N'-bis(salicylidene)-1,2-propanediamine (manufactured by Tokyo Kasei Kogyo Co., Ltd.) as the chelating flux agent (A) in MEK; a solution (0.1 parts by mass in terms of non-volatile portions) of 2-phenyl-4-methylimidazole as the curing accelerator in MEK; a slurry silica (SC-1050MLQ, average particle diameter: 0.3 m, 100 parts by mass in terms of non-volatile portions) as the inorganic filler (D); 10 parts by mass of an acrylic polymer (US-6170, manufactured by Toagosei Co., Ltd.) as the flexibility imparting component (E); and further a solution (25 parts by mass in terms of non-volatile portions) of a benzoxazine (Pd type benzoxazine, manufactured by SHIKOKU CHEMICALS CORPORATION) as the adherence imparting component in MEK were mixed and stirred for 30 minutes by using a high speed stirring apparatus, thereby obtaining a varnish. With this varnish, a polyethylene terephthalate film having a thickness of 38 μm (TR1-38), the surface of which was coated with a mold releasing agent, was coated, and it was heated and dried at 100° C. for 5 minutes, thereby obtaining a laminate.

3. Evaluation Method (1) Possibility of fabricating varnish

During the course of fabricating varnishes of Examples 1 to 6 and Comparative Examples 1 to 3, when gelation of the varnish, sedimentation of the resin composition component or the like is not confirmed, it was described as A, and when gelation of the varnish, sedimentation of the resin composition component or the like is confirmed, it was described as C. The results are shown in Table 2.

(2) Storage Stability of Varnish

The viscosity (c) of the varnishes obtained in Examples 1 to 6 and Comparative Examples 1 to 3 was measured using a B type viscometer (manufactured by TOKYO KEIKI INC.), and after leaving the varnishes in a closed container at room temperature for two weeks, the viscosity (d) was measured again using the B type viscometer. The rate of change in viscosity after two weeks had passed was calculated according to the following expression. When the rate of change is less than 20%, it was described as AA; when the rate of change in viscosity after two weeks have passed is 20% or more and less than 40%, it was described as A; and when the rate of change in viscosity after two weeks have passed is 40% or more, it was described as C. The results are shown in Table 2.

$$\text{rate of change in viscosity} = \{|(d)-(c)|/(c)\} \times 100$$

(3) Bonding Test

The laminates obtained in Examples 1 to 6 and Comparative Examples 1 to 3 were cut into 8 mm×8 mm squares and laminated on a substrate for evaluation, and then by using a flip chip bonder (LFB-2301, manufactured by SHINKAWA LTD.), a semiconductor chip was pressure bonded thereto under conditions with a stage temperature of 70° C., a bond head temperature of 300° C., a load of 50 N and a time of 8 seconds, thereby performing a bonding test. Through observation for the cross section of the bonding test sample, when alloy production is confirmed between the solder on the Cu pillar on the side of the semiconductor chip and the wiring on the side of the substrate, it was described as A, and when alloy production is not confirmed, it was described as C. The results are shown in Table 2.

(4) Appearance of Bonding Sample

The samples after the bonding test were observed with an optical microscope directly from the above of the semiconductor chip. When adhesion of the resin compositions obtained in Examples 1 to 6 and Comparative Examples 1 to 3 is not confirmed on the surface of the semiconductor chip, it was described as AA; when a slight amount of adhesion of the resin compositions obtained in Examples 1 to 6 and Comparative Examples 1 to 3 is confirmed on the surface of the semiconductor chip, but at a level that would not affect the quality in actual use, it was described as A; and when adhesion of the resin compositions obtained in Examples 1 to 6 and Comparative Examples 1 to 3 is confirmed on the surface of the semiconductor chip at a level that is not allowed for actual use, it was described as C. The results are shown in Table 2.

(5) Flexibility

The resin laminates obtained in Examples 1 to 6 and Comparative Examples 1 to 3 were cut into strips of 5 cm×10 cm, and they were wound around a metal tube with an outer diameter of 3 cm at room temperature such that the polyethylene terephthalate film, which is the supporting material, was placed inside; retained for 5 seconds; and then unwound. After repeating this operation 10 times, the presence or absence of cracks in the resin composition layer of the present invention was visually confirmed, thereby performing evaluation of flexibility. When occurrence of cracks is not found at all, it was described as AA; when occurrence of a slight amount of cracks is found but at a level that would not affect the quality in actual use, it was described as A; and when cracks occur at a level that is not allowed for actual use, it was described as C. The results are shown in Table 2.

(6) Insulation Reliability

The laminates obtained in Examples 1 to 6 and Comparative Examples 1 to 3 were each stuck to a fine circuit pattern with L/S=40 μm/40 μm of a printed wiring board with a vacuum laminator, to fill the gaps between the fine wirings. Using an oven, the fine circuit pattern substrate with a laminate fabricated as described above was heated at 200° C. for 3 hours, thereby fabricating a test sample. As a pretreatment, the obtained test sample was subjected to a humidification heat treatment under conditions with a temperature of 85° C. and a humidity of 60% for 168 hours, and the treated sample was allowed to pass through a reflow step in which the maximum temperature was set to 260° C. three times. For the test sample after the pretreatment, the continuous humidity insulation resistance was measured under conditions with a temperature of 130° C., a humidity of 85% and an applied voltage of 5.0 V. As the evaluation criteria, a resistance value of $10^7 \Omega$ or less is defined as a short circuit. When it takes 300 hours or longer until being short circuited, it was described as A, and when it takes less than 300 hours, it was described as C. The results are shown in Table 2.

between a semiconductor chip and a semiconductor wafer, and even the joint between a semiconductor chip and a semiconductor chip. Therefore, it is extremely useful.

The invention claimed is:

1. A resin composition comprising:
   a chelating flux agent (A);
   a thermal radical polymerization initiator (B); and
   a radical polymerizable compound (C);
   wherein a content of the chelating flux agent (A) in the resin composition is 10 parts by mass or more and 50 parts by mass or less based on 100 parts by mass of a total amount of the radical polymerizable compound (C);
   wherein the chelating flux agent (A) comprises a compound represented by the following formula (1):

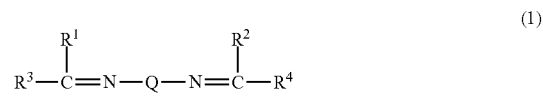

wherein
   Q is an arylene group, an alkylene group, an alkenylene group, a cycloalkylene group, a cycloalkenylene group, a heterocyclylene group or a heteroarylene group,
   $R^1$ and $R^2$ are each independently a hydrogen atom, a methyl group, an ethyl group, a propyl group, a butyl group, a pentyl group or a hexyl group,
   $R^3$ and $R^4$ are each a 2-hydroxyphenyl group, and
   for the arylene group, the alkylene group, the alkenylene group, the cycloalkylene group, the cycloalkenylene group, the heterocyclylene group, and the heteroarylene group, a hydrogen atom bonded to the group is optionally substituted with a hydroxy group or a mercapto group,

TABLE 2

|  | Example 1 | Example 2 | Example 3 | Example 4 | Example 5 | Example 6 | Comaprative Example 1 | Comaprative Example 2 | Comaprative Example 3 |
|---|---|---|---|---|---|---|---|---|---|
| Possibility of fabricating varnish | A | A | A | A | A | A | A | A | A |
| Storage stability of varnish | AA | AA | AA | AA | A | AA | AA | C | C |
| Bonding test | A | A | A | A | A | A | C | A | C |
| Appearance of bonding sample | AA | AA | AA | AA | AA | A | AA | C | C |
| Flexibility | AA | AA | AA | AA | A | AA | AA | AA | AA |
| Insulation reliability | A | A | A | A | A | A | C | A | C |

The present application is based on Japanese Patent Application No. 2018-84967 filed on Apr. 26, 2018, the contents of which are incorporated herein by reference.

INDUSTRIAL APPLICABILITY

As described above, the resin composition of the present invention is excellent in flux activity, flexibility and low thermal expansion properties, and exhibits a variety of effects. Therefore, it can be suitably used as a resin composition, in particular, as a resin composition for adhesives. In addition, the resin composition of the present invention is useful as a pre-applied underfill material. The resin composition of the present invention is excellent in flux activity and a good joint state can thus be obtained upon performing the joint between a semiconductor chip and a substrate, the joint and/or an imine compound represented by the following formula (2):

wherein
   $R^5$ is a hydrogen atom, a methyl group, an ethyl group, a propyl group, a butyl group, a pentyl group or a hexyl group,
   $R^6$ and $R^7$ are each independently an alkyl group, a cycloalkyl group, an aryl group, a heteroaryl group or a heterocyclyl group, and for the alkyl group, the cycloalkyl group, the aryl group, the heteroaryl group and the heterocyclyl group, a hydrogen atom bonded to the group is optionally substituted with a hydroxy group or a mercapto group; and wherein the radical polymerizable compound (C) comprises:

a maleimide compound represented by the following formula (4):

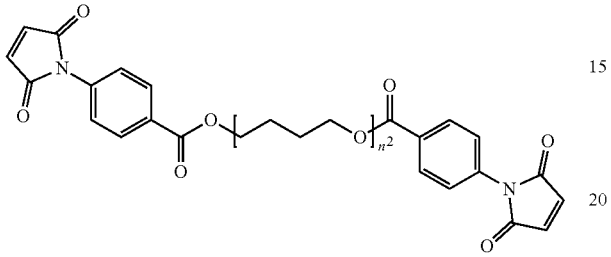

wherein
an average value of $n^2$ is 1 or more and 30 or less, and at least one maleimide compound selected from the group consisting of:
2,2-bis(4-(4-maleimidophenoxy)phenyl)propane,
a maleimide compound represented by the following formula (3):

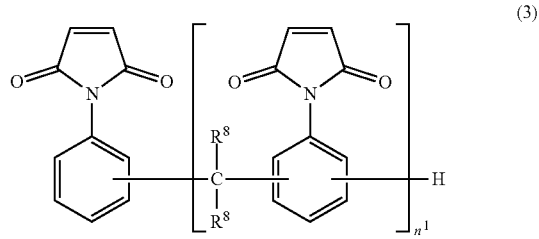

wherein
each $R^8$ independently represents a hydrogen atom or a methyl group, and
$n^1$ represents an integer of 1 or more, and
a maleimide compound represented by the following formula (5):

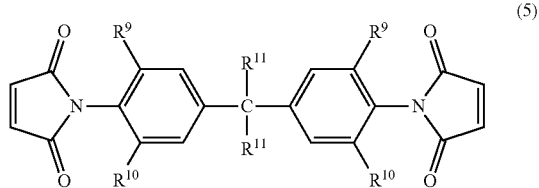

wherein
$R^9$ and $R^{10}$ each independently represent a hydrogen atom, a methyl group or an ethyl group, and
each $R^{11}$ independently represents a hydrogen atom or a methyl group.

2. The resin composition according to claim 1, wherein the chelating flux agent (A) has a melting point of 235° C. or lower.

3. The resin composition according to claim 1, wherein the chelating flux agent (A) has a molecular weight of 150 or more and 500 or less.

4. The resin composition according to claim 1, wherein a contact angle of a solder ball obtained in the following solder wettability test using the chelating flux agent (A) is less than 1.20 radians:

(Solder wettability test)
a glossy surface of a copper foil with a thickness of 12 μm is coated with the chelating flux agent, and a solder ball with a diameter of 0.5 mm is placed on the chelating flux agent; the resultant is then heated for 1 minute on a hot plate kept at 235° C. to melt the solder, which is then cooled at room temperature; and after the cooling, a radius (a) of the solder ball spread on the copper foil and a height (b) of the solder ball were measured, and a contact angle was calculated according to the following expression:

contact angle of solder ball=2 arctan$\{(b)/(a)\}$.

5. The resin composition according to claim 1, wherein the chelating flux agent (A) comprises at least one selected from the group consisting of N,N'-bis(salicylidene)-1,2-propanediamine, N,N'-bis(salicylidene)ethylenediamine, N,N'-bis(salicylidene)-1,3-propanediamine and N,N'-bis(salicylidene)-1,2-phenylenediamine.

6. The resin composition according to claim 1, wherein the chelating flux agent (A) comprises at least one selected from the group consisting of N,N'-bis(salicylidene)-1,2-propanediamine and N,N'-bis(salicylidene)-1,3-propanediamine.

7. The resin composition according to claim 1, wherein the thermal radical polymerization initiator (B) is an organic peroxide.

8. The resin composition according to claim 7, wherein the thermal radical polymerization initiator (B) has a 10 hour half-life period temperature of 100° C. or higher.

9. The resin composition according to claim 7, wherein the thermal radical polymerization initiator (B) is a dialkyl peroxide and/or a hydroperoxide.

10. The resin composition according to claim 7, wherein the thermal radical polymerization initiator (B) comprises at least one selected from the group consisting of dicumyl peroxide, di(2-tert-butylperoxyisopropyl)benzene, di-tert-butyl peroxide, 1,1,3,3 -tetramethylbutyl hydroperoxide, 2,5-dimethyl-2,5-di(tert-butylperoxyperoxyperoxy)hexyne-3, 2,5 -dimethyl-2,5-di(tert-buty 1p eroxyperoxyperoxy) hexane, di-tert-hexyl peroxide, tert-butyl cumyl peroxide, di-tert-amyl peroxide, tert-amyl hydroperoxide, tert-butyl hydroperoxide, cumene hydroperoxide, diisopropylbenzene hydroperoxide and p-menthane peroxide.

11. The resin composition according to claim 7, wherein the thermal radical polymerization initiator (B) comprises at least one selected from the group consisting of dicumyl peroxide, cumene hydroperoxide, diisopropylbenzene hydroperoxide, di(2-tert-butylperoxyisopropyl)benzene and p-menthane peroxide.

12. The resin composition according to claim 1, wherein a content of the thermal radical polymerization initiator (B) in the resin composition is 0.005 parts by mass or more and 5 parts by mass or less based on 100 parts by mass of a total amount of the radical polymerizable compound (C).

13. The resin composition according to claim 1, further comprising an inorganic filler (D).

14. The resin composition according to claim 13, wherein the inorganic filler (D) has an electrical insulation property.

15. The resin composition according to claim 13, wherein the inorganic filler (D) comprises at least one selected from the group consisting of silica, aluminum hydroxide, alumina, boehmite, boron nitride, aluminum nitride, magnesium oxide and magnesium hydroxide.

16. The resin composition according to claim 13, wherein the inorganic filler (D) has an average particle diameter of 3 μm or less.

17. The resin composition according to claim 13, wherein a content of the inorganic filler (D) in the resin composition is 300 parts by mass or less based on 100 parts by mass of a total amount of the radical polymerizable compound (C).

18. The resin composition according to claim 1, further comprising a flexibility imparting component (E).

19. The resin composition according to claim 18, wherein
the flexibility imparting component (E) comprises a thermoplastic polymer compound; and
the thermoplastic polymer compound has a weight average molecular weight of 1,000 or more and 1,000,000 or less.

20. The resin composition according to claim 18, wherein the flexibility imparting component (E) is a (meth)acrylic oligomer and/or a (meth)acrylic polymer.

21. The resin composition according to claim 1, for use in a pre-applied underfill material.

22. A laminate comprising:
a supporting material; and
a layer comprising the resin composition according to claim 1 laminated on the supporting material.

23. A semiconductor wafer with a resin composition layer, comprising:
a semiconductor wafer; and
the laminate according to claim 22 laminated on the semiconductor wafer,
wherein the layer comprising the resin composition is laminated on the semiconductor wafer.

24. A substrate for mounting a semiconductor with a resin composition layer, comprising:
a substrate for mounting a semiconductor; and
the laminate according to claim 22 laminated on the substrate for mounting the semiconductor,
wherein the layer comprising the resin composition is laminated on the substrate for mounting the semiconductor.

25. A semiconductor device comprising the semiconductor wafer with the resin composition layer according to claim 23.

26. A semiconductor device comprising the substrate for mounting the semiconductor with the resin composition layer according to claim 24.

* * * * *